United States Patent
Yoshizawa et al.

[11] Patent Number: 5,819,406
[45] Date of Patent: Oct. 13, 1998

[54] METHOD FOR FORMING AN ELECTRICAL CIRCUIT MEMBER

[75] Inventors: Tetsuo Yoshizawa, Yokohama; Toyohide Miyazaki, Inashiki-gun; Hiroshi Kondo, Osaka; Yoshimi Terayama, Odawara; Takashi Sakaki, Tokyo, all of Japan

[73] Assignee: Canon Kabushiki Kaisha, Tokyo, Japan

[21] Appl. No.: 689,131

[22] Filed: Jul. 30, 1996

Related U.S. Application Data

[62] Division of Ser. No. 373,496, Jan. 17, 1995, abandoned, which is a continuation of Ser. No. 90,996, Jul. 13, 1993, abandoned, which is a continuation of Ser. No. 750,472, Aug. 27, 1991, abandoned.

[30] Foreign Application Priority Data

Aug. 29, 1990 [JP] Japan ................................ 2-225084
Aug. 29, 1990 [JP] Japan ................................ 2-225085

[51] Int. Cl.$^6$ ........................... H01R 43/02; H01R 9/09; H05K 3/38
[52] U.S. Cl. ............................. 29/877; 29/830; 29/840; 29/843; 29/846; 29/884; 156/295; 228/180.22; 439/66; 439/91; 439/591
[58] Field of Search .......................... 29/832, 840, 842, 29/854, 877, 884, 830, 843, 846; 156/73.1, 295; 228/180.21, 180.22; 439/66, 91, 591

[56] References Cited

U.S. PATENT DOCUMENTS

| | | | |
|---|---|---|---|
| 4,157,932 | 6/1979 | Hirata | 29/885 |
| 4,249,302 | 2/1981 | Crepeau | 29/852 |
| 4,449,774 | 5/1984 | Takashi et al. | 439/590 |
| 4,705,205 | 11/1987 | Allen et al. | 439/70 |
| 4,740,657 | 4/1988 | Tsukagoshi et al. | 174/88 R |
| 4,814,040 | 3/1989 | Ozawa | 29/846 |
| 4,862,588 | 9/1989 | MacKay | 29/854 X |
| 4,926,549 | 5/1990 | Yoshizawa et al. | 29/876 |

(List continued on next page.)

FOREIGN PATENT DOCUMENTS

| | | |
|---|---|---|
| 0501358 | 2/1992 | European Pat. Off. ................ 29/854 |
| 422096 | 1/1942 | Japan . |
| 6057944 | 4/1985 | Japan . |
| 60-216411 | 10/1985 | Japan . |
| 6178069 | 4/1986 | Japan . |
| 61-174643 | 8/1986 | Japan . |
| 59-139636 | 8/1988 | Japan . |
| 63-222437 | 9/1988 | Japan . |
| 63-224235 | 9/1988 | Japan . |

OTHER PUBLICATIONS

L.S. Goldmann, "Geometric Optimization of Controlled Collapse Interconnections," IBM Journal of Research and Development, Index vol. 13, pp. 251–265 (May 1969).

K.C. Norris, et al., "Reliability of Controlled Collapse Interconnections," IBM Journal of Research and Development, Index vol. 13, pp. 266–271, (May 1969).

*Primary Examiner*—Peter Vo
*Attorney, Agent, or Firm*—Fitzpatrick, Cella, Harper & Scinto

[57] ABSTRACT

A method for producing an electrical circuit member includes the steps of positioning and arranging first and second electrical circuit parts having plural electrical connecting portions to be spaced and oppose each other, preparing an electrical connecting member having a plurality of electrical conductive members, each of which extends from one side of a holding member of an electrical insulating material therethrough to an opposite side of the holding member and is held in the holding member so that opposing ends of the electrical conductive member protrude from opposite sides of the holding member, and applying an adhesive to at least one side of the electrical connecting member including the electrical conductive members. The electrical connecting member with the adhesive is inserted between the first and second electrical circuit parts, and a pressing force is applied so that the first and second electrical parts contact the ends of the electrical conductive members.

15 Claims, 16 Drawing Sheets

U.S. PATENT DOCUMENTS

| | | | |
|---|---|---|---|
| 5,045,249 | 9/1991 | Jin et al. | 439/591 |
| 5,058,800 | 10/1991 | Yoshizawa et al. | 228/180.2 |
| 5,065,505 | 11/1991 | Matsubara et al. | 29/830 |
| 5,084,961 | 2/1992 | Yoshikawa | 29/840 |
| 5,095,627 | 3/1992 | Bujagec et al. | 29/832 |
| 5,109,601 | 5/1992 | McBride | 29/840 |
| 5,118,370 | 6/1992 | Ozawa | 156/295 X |
| 5,179,777 | 1/1993 | Suzuki | 29/830 X |
| 5,384,952 | 1/1995 | Matsui | 29/840 |
| 5,431,571 | 7/1995 | Hanrahan et al. | 439/91 |
| 5,432,999 | 7/1995 | Capps et al. | 29/830 |

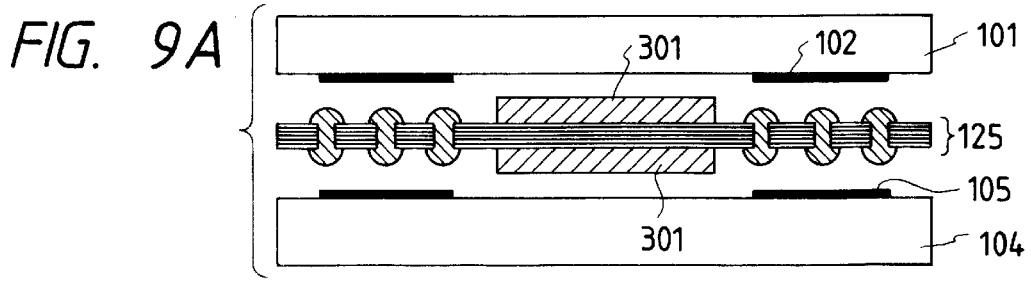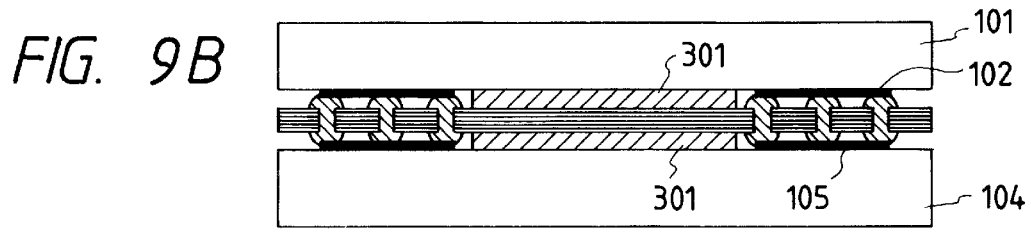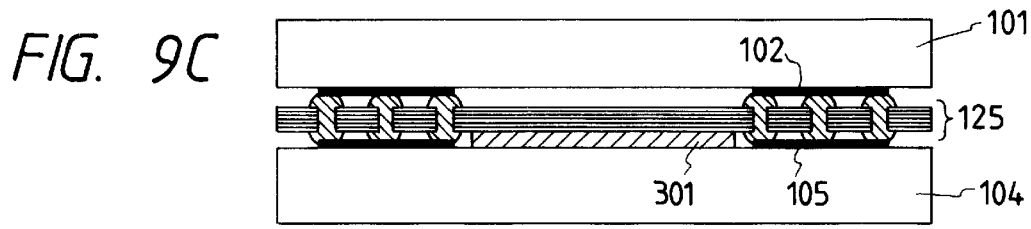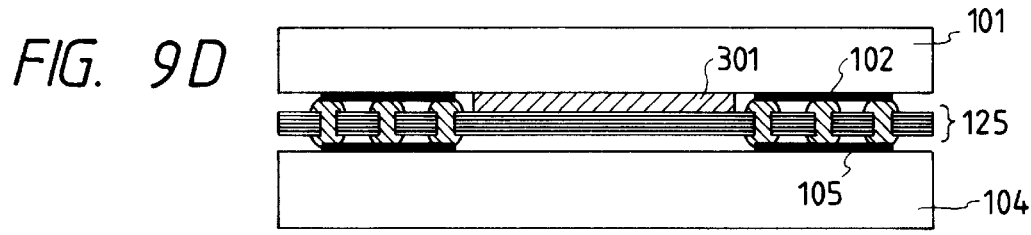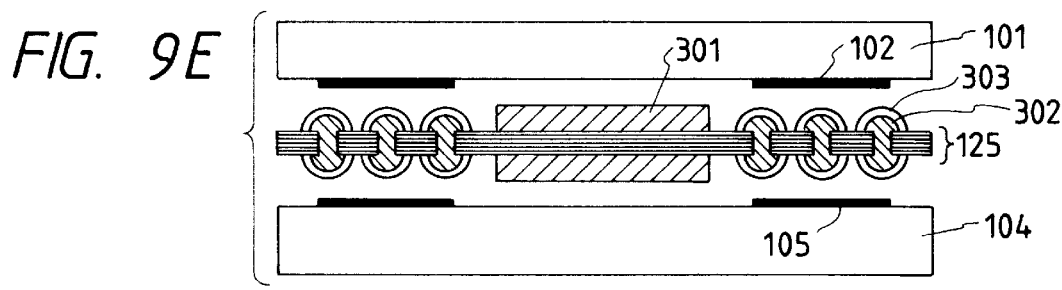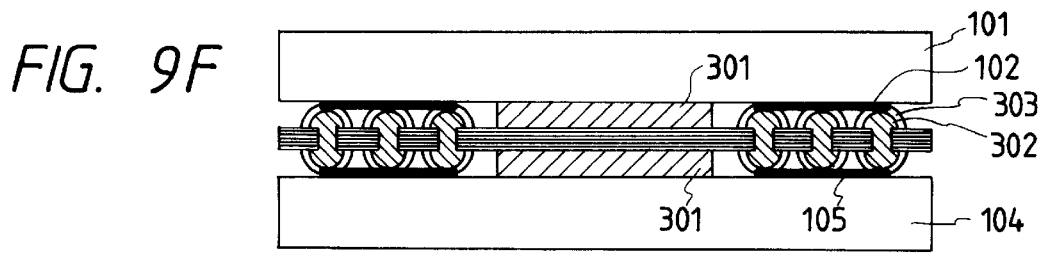

METHOD FOR FORMING AN ELECTRICAL CIRCUIT MEMBER

This application is a division of application Ser. No. 08/373,496, filed Jan. 17, 1995, which is a continuation of application Ser. No. 08/090,996, filed Jul. 13, 1993, which is a continuation of application Ser. No. 07/750,472, filed Aug. 27, 1991, all now abandoned.

BACKGROUND OF THE INVENTION

1. Field of the Invention

This invention relates to an electrical circuit member having, for example, electrical circuit parts mutually electrically connected to each other, particularly to an electrical circuit member connected by use of an electrical connecting member. Also, the electrical circuit member of the present invention is applied particularly to, for example, an electrical circuit device comprising an electrical circuit member constituted of electrical circuit parts electrically connected to each other encapsulated.

2. Related Background Art

As the connecting method mutually between circuit substrates, lead frames, semiconductor elements, between circuit substrate and lead frame, between circuit substrate and semiconductor element and between lead frame and semiconductor element, etc., there have been known the connector method, the pressure contact terminal method, the soldering method, the wire bonding method, TAB (Tape Automated Bonding) method, CCB (Controlled Collapsed Bonding) method, etc.

Representative examples of such methods are shown below.

(1) Wire bonding method

FIG. 14 and FIG. 15 show a representative example of a semiconductor device connected by the wire bonding method and encapsulated, and in the following, the wire bonding method is described by referring to FIG. 14 and FIG. 15.

This method is a method in which the semiconductor element 4 is fixed and supported on the element mounting portion 2 by use of Ag paste 3, etc., and then the connecting portion 5 of the semiconductor element 4 and the desired connecting portion 6 of the lead frame 1 are electrically connected by use of a very fine metal wire 7 of gold, etc.

After connection, the semiconductor element 4 and the lead frame 1 are encapsulated according to the transfer method, etc. by use of a thermosetting resin 8 such as epoxy resin, etc., and then the unnecessary portion of the lead frame 1 extending outwardly from the resin encapsulated part is cut, or bent to a desired form to make the semiconductor device 9.

(2) TAB (Tape Automated Bonding) method (see, for example, Japanese Laid-open Patent Application No. 59-139636)

FIG. 16 shows a representative example of the semiconductor device connected by the TAB method and encapsulated.

This method is an automatic bonding method according to the tape carrier system. This method is described by referring to FIG. 16. After registration between the carrier film substrate 16 and the semiconductor element 4, the inner lead portion 17 of the carrier film substrate 16 and the connecting portion 5 of the semiconductor element 4 are connected by thermal pressure adhesion. After connection, encapsulation is effected with a thermosetting resin 20, 21 such as epoxy resin, etc. to provide the semiconductor device 9.

(3) CCB (Controlled Collapse Bonding) method (see, for example, Japanese Patent Publication No. 42-2096, Japanese Laid-open Patent Application No. 60-57944)

FIG. 17 shows a representative example of the semiconductor device connected and encapsulated according to the CCB method. This method is described by referring to FIG. 17. This method is also called the flip chip bonding method.

The connecting portion 5 of the semiconductor element 4 is previously provided with the solder bump 31, and the semiconductor element 4 provided with the solder bump 31 is mounted with registration on the circuit substrate 32. Then, by heating and melting the solder, the circuit substrate 32 and the semiconductor element 4 are connected and subjected to flux washing, followed by encapsulation to make the semiconductor device 9.

(4) Method shown in FIG. 18 and FIG. 19

At the portion other than the connecting portion 5 of the semiconductor element 4 is formed the insulating film 71 comprising polyimide, etc., the connecting portion 5 is provided with the metal material 70 comprising Au, etc., and then the metal material 70 and the exposed surfaces 73, 72 of the insulating film 71 are flattened. On the other hand, at the portion other than the connecting portion 5a is formed the insulating film 71a comprising polyimide, etc., and the connecting portion 5a is provided with the metal material 70a, and then the metal material 70a, and the exposed surfaces 73a, 72a of the insulating film 71a are flattened.

Thereafter, as shown in FIG. 19, the first semiconductor element 4 and the second semiconductor element 4a are thermally pressure adhered after registration, whereby the connecting portion 5 of the first semiconductor element 4 and the connecting portion 5a of the second semiconductor element 4a are connected through metal materials 70, 70a.

(5) The method shown in FIG. 20

Also, as another bonding method, there has been known the method with an anisotropic electroconductive film (see Japanese Laid-open Patent Applications Nos. 60-216411, 61-78069, 61-174643, etc.).

Anisotropic electroconductive film is shaped in a sheet having electroconductive particles of a metal, etc. dispersed in an electrically insulating adhesive, which can be electrically bonded by interposing an anisotropic electroconductive film between the substrates having bonding portions.

FIG. 20A and 20B are schematic views showing the electrical connection between electrical circuit parts by use of one such anisotropic electroconductive film, in which 21 is anisotropic electroconductive film, 100 and 110 are electrical circuit parts to be connected, showing circuit substrates in the present example. The anisotropic electroconductive film is shaped in a sheet having the constitution of metal particles 151 of Ni, solder, etc. dispersed in the electrically insulating substance 150 (adhesive, etc.). On the circuit substrate 100 are formed a conductor pattern 101 and a resist 102, and it has a plurality of bonding portions 103. The circuit substrate 110 also similarly has the conductor pattern 111, the resist 112 and the bonding portions 113. FIG. 20A shows the state before bonding. And, by pressurizing and heating the circuit substrates 100 and 110, the connecting portion 103 of the electrical circuit part 100 and the connecting portion 113 of the electrical circuit part 110 are electrically connected (FIG. 20B).

FIG. 21 is an example using similarly an anisotropic electroconductive film, in which different electrical circuit parts from the previous example are connected.

(6) Method shown in FIG. 22

This is a method in which an elastic connector 83 comprising an insulating substance 81 having a metal wire 82 comprising Fe, Cu, etc. arranged directed in a constant direction is interposed between the first circuit substrate 75 and the second circuit substrate 75a, the first circuit substrate 75 and the second circuit substrate 75a are pressurized after registration, thereby connecting the connecting portion 76 of the first circuit substrate 75 to the connecting portion 76a of the second circuit substrate 75a.

(7) Further, it has been proposed to connect electrically mutually the electrical circuit parts by use of an electrical connecting member having such constitution that a plurality of electroconductive members mutually insulated from each other are held in an insulating holding member, and both ends of said electroconductive member are exposed on both surfaces of said holding member on the same plane as or protruded from said holding member surface (see Japanese Laid-open Patent Applications Nos. 63-222437, 63-224235, etc.).

FIGS. 23A and 23B are a schematic view showing electrical connection between electrical circuit parts by use of one such electrical connecting member, in which 31 shows the electrical connecting member, 32 and 33 the electrical circuit parts to be connected. The electrical connecting member 31 consists of a plurality of rod-shaped electroconductive members 34 comprising a metal or alloy held on a holding member 35 shaped in thin plate comprising an electrically insulating material with the respective electroconductive members 34 being electrically insulated from each other, and both ends of the electroconductive member 34 are respectively made bumps 38 and 39 to be protruded toward the electrical circuit part 32 and 33 sides (FIG. 23A). And, the connecting portion 36 of one electrical circuit part 32 and the bump 38 of the electroconductive member 34, and also the connecting portion 37 of the other electrical circuit part 33 and the bump 39 of the electroconducive member 34 are respectively connected by, for example, metallization and/or alloy formation by thermal pressure adhesion, sonication heating method, etc. to effect electrical connection mutually between the electrical circuit parts 32 and 33 (FIG. 23B).

However, there are tasks to be solved as shown below in the respective methods as described above, and encapsulation after connection.

(1) Wire bonding method (a) Referring to FIG. 14, when the connecting portion 5 of the semiconductor element 4 is designed to be arranged internally of the semiconductor element 4, because the extremely fine metal wire 7 is very small in wire diameter, it becomes readily contacted with the outer peripheral portion 10 of the semiconductor element 4 or the outer peripheral portion 11 of the element mounting portion 2 of the lead frame. If the extremely fine metal wire 7 contacts these outer peripheral portions 10 or 11, electrical short-circuit will occur. Further, the length of the extremely fine metal wire 7 must but be made longer, whereby the extremely fine metal wire 7 becomes susceptible to deformation during transfer mold molding, and if such deformation is great, the extremely fine wires 7 will contact each other to effect electrical short-circuit.

Therefore, it is required that the connecting portion 5 of the semiconductor element 4 should be arranged at the peripheral portion on the semiconductor element 4, and therefore it must but be restricted in circuit design.

(b) Because the semiconductor element 4 and the lead frame 1 are connected by the extremely fine metal wire 7, horizontal spreading necessary for connection is required, and if this is attempted to be made smaller, short-circuit as mentioned above in (a) will occur. Hence, in the wire bonding method, the size in the horizontal direction necessary for connection cannot be made smaller, which is not suitable for real mounting of high density.

(c) In the wire bonding method, for avoiding contact mutually between the adjacent extremely fine metal wires 7, an interval to some extent must be taken as the pitch dimension of the connecting portion on the semiconductor element 4 (distance between the centers of the adjacent connecting portion). When the size of the semiconductor element 4 is determined, the connectable region will be necessarily determined. However, as described above, according to the wire bonding method, this pitch dimension is generally large as about 0.2 mm, and therefore the number of the connecting portions connectable to the connectable regions must be made smaller.

(d) The wire bonding work will take a long time. Particularly, when the connecting number is increased, the bonding time becomes longer to worsen production efficiency.

(e) In encapsulation after connection, if the tolerable range of transfer mold conditions is surpassed for some reason, there is a fear that the extremely fine metal wire 7 may be deformed, or even cut in the worst case.

Also, at the connecting portion 5 on the semiconductor element 4, Al not formed into alloy with the extremely fine metal wire 7 is exposed, and therefore Al corrosion is liable to occur, whereby there is a fear that reliability may be lowered.

(2) TAB method (a) Referring to FIG. 16, when the connecting portion 5 of the semiconductor element 4 is attempted to be designed to be positioned inside of the semiconductor element 4, the length l of the inner lead portion 17 of the carrier film substrate 16 becomes longer, whereby the inner lead portion 17 is liable to be deformed, whereby the inner lead portion cannot be connected to the desired connecting portion 5, or the inner lead portion 17 contacts the portion other than the connecting portion 5 of the semiconductor element 4. For avoiding this, it becomes necessary to arrange the connecting portion 5 of the semiconductor element 4 at the peripheral portion on the semiconductor element 4, whereby restrictions are imposed in designing.

(b) Also in the TAB method, it is necessary to take the pitch dimension of the connecting portion on the semiconductor element 4 at about 0.09 to 0.15 mm, and therefore similarly as mentioned in the problem (c) of the wire bonding method, it becomes difficult to increase the number of connecting portions.

(c) Also in the TAB method, as the direction of connection, the connection is in the horizontal direction similarly as in the wire bonding method, and therefore it is difficult to make the size in the horizontal direction smaller, as to be unsuitable for real mounting of high density.

(d) For preventing contact of the inner lead portion 17 of the carrier film substrate 16 with the portion other than the connecting portion 5 of the semiconductor element 4, the connecting shape of the inner lead portion 17 is demanded for that purpose, whereby the cost becomes higher.

(e) For connecting the connecting portion 5 of the semiconductor element 4 to the inner lead portion 17, a gold bump must be attached to the connecting portion 5 of the semiconductor element 4 or the connecting portion of the inner lead portion 17, whereby the cost becomes higher.

(f) Since the thermal expansion coefficient of the semiconductor element 4 is different from the thermal expansion coefficients of the resins 20, 21, when heat is applied on the semiconductor device 9, heat stress is generated, whereby characteristic deterioration of the semiconductor element 4 is caused to occur. Further, cracking occurs in the semiconductor element 4, the resin 20 or the resin 21, whereby reliability of the device is lowered. Such phenomenon becomes conspicuous when the size of the semiconductor element 4 is large.

(3) CCB method (a) Referring to FIG. 17, since solder bump 31 must be formed at the connecting portion 5 of the semiconductor element 4, the cost becomes higher.

(b) If the solder amount of bump is large, a bridge is formed between the adjacent solder bumps (the phenomenon of mutual contact between the adjacent solder bumps), while on the contrary, if the solder amount of bump is small, the connecting portion 5 of the semiconductor element 4 and the connecting portion 33 of the circuit substrate 32 will not be connected, whereby electrical conduction cannot be taken. That is, reliability of connection is lowered. Further, there is the problem that the solder amount and the solder shape for connection influence reliability of connection (see "Geometric Optimization of Controlled Collapse Interconnections", L. S. Goldman, IBM J. RES. DEVELOP. 1969, MAY, pp. 251–265, "Reliability of Controlled Collapse Interconnections", K. C. Norris, A. H. Landzberg, IBM J. RES. DEVELOP. 1969, MAY, 226–271, Technical Information of Soldering Technique Research Association, No. 017-'84, published by Soldering Technique Research Association).

Thus, whether the amount of the solder bump is more or less influences reliability of connection, and therefore it is required to control the amount of the solder bump 31.

(c) If the solder bump exists inside of the semiconductor element 4, it becomes difficult to visually inspect whether connection is done well.

(d) Since heat dissipatability of semiconductor element is poor (see Electronic Packaging Technology 1987.1. (Vol.3, No.1) pp. 66–71, NIKKEI MICRODEVICES 1986.5.pp.97–108) great steps contrivances are required for making heat dissipation characteristic good.

(e) Since there is employed the Surface Down Mount system in which the connecting portion of the semiconductor element 4 and the connecting portion of the circuit substrate 32 are connected with registration, registration can be done with difficulty and the preparation device becomes larger in scale. Also, connection is done by reflowing after mounting, and therefore positional slippage may occur during conveying.

(4) Technique shown in FIG. 18 and FIG. 19

(a) The exposed surface 72 of the insulating film 71 and the exposed surface 73 of the metal material 70 must be flattened, and further the exposed surface 70' of the insulating film 71' and the exposed surface 73' of the metal material 70' must be flattened, whereby the steps are increased to make the cost higher.

(b) If there is unevenness on the exposed surface 72 of the insulating film 71 and the exposed surface 73 of the metal material 70, or there is unevenness on the exposed surface 72' of the insulating film 71' and the exposed surface 73' of the metal material 70', the metal material 70 and the metal material 70' will not be connected to lower reliability.

(c) Also in this system, Surface Down Mount system is employed, similarly as described in the problem (e) of the CCB method, registration can be done with difficulty, and the preparation device becomes larger in scale.

(5) The method shown in FIG. 20

The anisotropic electroconductive film as described above utilizes lowering of electrical resistance value by contacting the adjacent metal particles by compression.

The bonding method by use of the anisotropic electroconductive film is characterized in that bonding can be effected at relatively lower temperature, and yet easily, but the pressure can be applied constantly with difficulty in connecting the connecting portion 101 and the connecting portion 111 by pressurization, and therefore the connected state is varied, resulting in great variance of contact resistance value at the connecting portion. For this reason, reliability becomes poor.

Also, when connection is effected with only the anisotropic electroconductive film interposed between the circuit substrates, if the pitch of the adjacent connecting portions (distance between the centers of the adjacent connecting portion) is made narrow, bonding of the electroconductive particles between the adjacent connecting portions will be also increased, whereby the resistance value becomes smaller, thus being unsuitable for connection of high density. Also, although the electroconductive particles 151 are randomly dispersed, the particles will mutually contact each other also at the portion with high density of particles to short-circuit the connecting portion, thus being unsuitable for connection of high density.

Further, since the amount of the electroconductive material dispersed is limited, no narrow pitch multi-pin bonding can be effected. Further, because of bonding mutually between metal particles, the bonding area becomes smaller, the bonding points become more, and also the area of the connecting portion between the metal particles and the electrical circuit part becomes smaller, whereby electrical characteristics are poor such that electrical resistance value becomes higher, etc.

(d) Also, as shown in FIG. 21, since the resistance value changed depending on variance in the protruded amount $h_1$ of the connecting portions 101, 111 of the circuit substrates 100, 110, it is necessary to make the varied amount of $h_1$ smaller.

Otherwise, when the bonding portion of the electrical circuit part is concave-shaped, the electrical resistance value of the peripheral portion 106 is low and the electrical resistance value of the bonding portion 101 high to worsen the electrical characteristics, and therefore no electrical circuit part can be used unless the bonding portion is convex-shaped. When the bonding portion is concave-shaped, it is necessary to make an electrical circuit part shaped in convex by arranging a bump, etc. at the bonding portion.

(6) Technique shown in FIG. 22

(a) Pressurization is necessary, and a pressurizing implement is necessary.

(b) Since the contact resistance of the metal wire 82 of the elastic connector 83 with the connecting portion 76 of the first circuit substrate 75 or with the connecting portion 76a of the second circuit substrate 75a changes depending on the pressurization force and the surface state, reliability of connection is poor.

(c) Since the metal wire 82 of the elastic connector 83 is a rigid body, if the pressurizing force is great, there is great possibility that the surface of the elastic connector 83, the first circuit substrate 75 and the second circuit substrate 75 may be damaged. On the other hand, if the pressurizing force is small, reliability of connection becomes poor.

(d) Further, the protruded amount $h_2$ of the connecting portions 76, 76a of the circuit substrates 75, 75a or the protruded amount $h_3$ of the metal wire 82 of the elastic connector 83, and their variances have influences on resistance value change and damage, and therefore contrivances to make variance smaller are required.

(e) Further, when the elastic connector is used for connecting the semiconductor element to the circuit substrate or the first semiconductor element to the second semiconductor element, the same defects similarly as in (a) to (d) will appear.

(7) In the bonding method by use of the electrical connecting member as described above, since the thickness of the electrical connecting member is thin, thermal stress becomes large when the thermal expansion coefficients mutually of the electrical circuit parts are large, whereby there ensues the problem of quality reliability. For this reason, there has been proposed the method of making the thickness of the electrical connecting member thicker, which however involves problems of high cost, etc.

SUMMARY OF THE INVENTION

The present invention has been accomplished in view of the state of the art as described above, and is intended to provide an electrical circuit member, which can effect connection with narrow pitch and high strength, has good electrical characteristics, does not depend on the uneven structure of the electrode, does not depend on the thermal expansion coefficient of the electrical circuit part, and yet can be prepared easily, with low cost and good reliability.

Another object of the present invention is to effect connection at low temperature in connecting mutually the electrical circuit parts.

According to the present invention, as one which can accomplish the object as mentioned above, there is provided an electrical circuit member comprising:

an electrical connecting member having a plurality of electroconductive members held on a holding member comprising an electrically insulating material, with the two ends of said each electroconductive member being exposed from said electrically insulating material, a first electrical circuit part having an electrical connecting portion and being electrically connected to one end of the electroconductive member of said connecting member at said connecting portion, a second electrical circuit part having an electrical connecting portion and being electrically connected to the other end of the electroconductive member of said connecting member at said connecting portion, at least a part of at least one between said connecting member and said first circuit part or between said connecting member and said second circuit part being adhered by interposing an adhesive constituted of an electrically insulating material; or:

an electrical connecting member having a plurality of electroconductive members held on a holding member comprising an electrically insulating material, with the two ends of said each electroconductive member being exposed from said electrically insulating material, first and second electrical circuit parts each having an electrical connecting portion, an anisotropic electroconductive film comprising electroconductive particles dispersed in an electrical insulating agent, the electrical connection mutually between said electrical circuit parts being effected through said electrical connecting member and anisotropic electroconductive film.

According to the present invention as described above, not only narrower pitch connection than in the case of using only an anisotropic electroconductive film is rendered possible, but also when one of the connecting portions of the electrical circuit parts is convex in shape, by arranging the electrical connecting members adjacent to the electrical circuit part side, because the electroconductive member of said electrical connecting member is convex in shape as protruded from the holding member surface, connection can be easily done even if the connecting portion of the electrical circuit part may be concave in shape, leak current can be reduced with low resistance value, whereby electrical characteristics can be also improved such as reduced floating capacity, etc. Also, when the thermal expansion coefficient difference mutually between the electrical circuit parts is large, use of both rather than either one of the electrical connecting member and the anisotropic electroconductive film will make the distance between the electrical circuit parts larger, and further the anisotropic electroconductive film is flexible relative to elongation and shrinkage, and therefore thermal stress is relaxed to increase more quality reliability.

Also, for connecting the electroconductive member of the electrical connecting member to the connecting portion of the electrical circuit part, at least a part other than the connecting portion can be adhered to connect the electroconductive member to the connecting portion of the electrical circuit part through its adhesive force, whereby electrical circuit parts with low heat resistance can be connected easily by relatively lower temperature adhesion, and also the scope of choice of the electrical parts can be expanded to make the application scope wider.

Also, according to the present invention, by connecting the electroconductive member of the electrical connecting member and the connecting portion of the electrical circuit part through metallization and/or alloy formation, the connection strength can be increased simultaneously with lowering of connection resistance value to increase connection reliability.

Also, according to the present invention, by forming a structure with the electrical connecting member connected to the connecting portion of the electrical circuit part, and an anisotropic electroconductive film interposed between the two electrical connecting members, there is not only the effect of improving the connection even when the connecting portions of the both electrical circuit parts are concave-shaped, but also thermal stress is relaxed by the enlarged distance between the electrical circuit parts to increase quality reliability.

Also, according to the present invention, by connecting the connecting portion of the electrical circuit part and the electroconductive member of the electrical connecting member through metallization and/or alloy formation, the connection strength is increased and the connection resistance value lowered.

Also, since an electrical circuit part and another electrical circuit part are connected by use of an electrical connecting member as described above, it becomes possible to arrange the connecting portion of an electrical circuit part not only at the peripheral portion but also internally thereof, whereby the number of connecting portions can be increased and hence higher densification is rendered possible.

Also, since the amount of the metal used for the electrical connecting member is small, the cost reduction becomes possible even if expensive gold may be used as the metal member.

Also, in the present invention, since the electrical connecting member and the electrical circuit part are fixed by use of an adhesive, the size of the connecting portion becomes smaller, sufficient connection strength can be obtained even if the size of the connecting portion becomes smaller to reduce the connection area, whereby higher densification becomes possible.

Also, in the present invention, since the electrical connecting member and the electrical circuit part are fixed with an adhesive, the strength of connection between the connecting portion of the electrical circuit part and the electrical electroconductive member is higher than that by use of the electrical connecting members of the prior art. In the method of the prior art, generally when the connecting strength at this portion is made higher, stability of the connection (for example, contact resistance value or its variance value) becomes higher (contact resistance value becomes smaller, and the variance width smaller), but enlargement of the connected region will result in making the connecting portion more susceptible to receiving thermal stress through the thermal expansion coefficient difference to lower reliability. However, in the present invention, since connection is done with an electrical connecting member interposed between an electrical circuit part and another electrical circuit part, even if thermal stress may be received, the thermal stress can be relaxed by deformation of the electrical connecting member, whereby the force applied on the connecting portion can be made smaller. Therefore, stability of the connecting portion which was difficult in the connecting method of the prior art can be enhanced, and further reliability enhanced.

Also, when connection is done between the connecting portion of an electrical circuit part and an electrical connecting member with an adhesive, the heating temperature required in performing connection by metallization and/or alloy formation can be lowered to great extent, and it becomes possible to connect electrical circuit parts with low heat resistance without pressurizing implement.

Further, when a plurality of other electrical circuit parts are connected to one electrical circuit part, only bad other electrical circuit parts can be removed by lowering the adhesive strength of the adhesive by heating or with a chemical, whereby it becomes possible to increase the yield to great extent.

Also, in the present invention, since the electrical circuit part is connected to other electrical circuit parts through an electrical connecting member, by use of a tape-shaped electrical connecting member connected with electrical circuit parts, an automatic connecting machine capable of connecting even an electrical circuit part having fine connecting portions to another electrical circuit part can be easily designed, whereby an electrical circuit device having stable bonding characteristics can be provided at low cost.

BRIEF DESCRIPTION OF DRAWINGS

FIG. 9A to 9F are schematic sectional views of another embodiment showing the connection relationship of electrical circuit parts.

DESCRIPTION OF THE PREFERRED EMBODIMENTS (Embodiments)

Figure 1A:
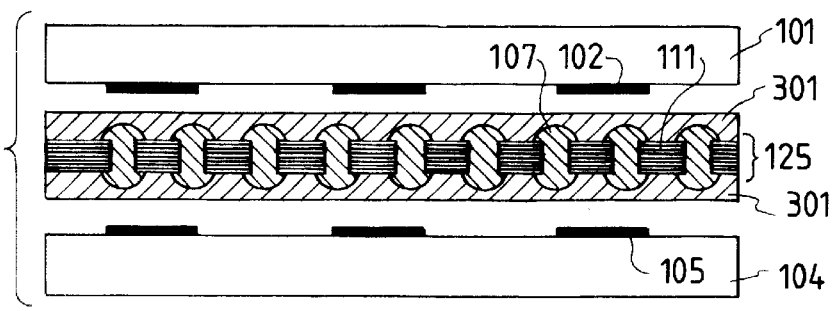
FIG. 1A and 1B are schematic sectional views of an embodiment showing the connection relationship of electrical circuit parts.

In describing the embodiments of the present invention, the constituting requirements of the present invention are individually described.

(Electrical circuit part)

Examples of the electrical circuit part in the present invention may include, for example, semiconductor elements such as transistor, IC, etc., circuit substrates such as resin circuit substrate, ceramic substrate, metal substrate, silicon substrate, glass substrate of flat display, etc. (hereinafter sometimes merely referred to as "circuit substrate"), lead frame, etc.

The electrical circuit part and other electrical circuit parts to be connected to the electrical connecting member may exist in only one or in a plural number.

As the electrical circuit part according to the present invention, one having a connecting portion is to be used. The number of the connecting portions is not limited, but the effect of the present invention will be more conspicuous as the number of connecting portions increases.

Also, the existing position of the connecting portion is not limited, but the effect of the present invention will be more marked for one having the connecting portion internally of the electrical circuit part.

The connecting portion is formed of an electroconductive material.

(Electrical connecting member)

The electrical connecting member according to the present invention has plurality of electroconductive members embedded in a holding member comprising an electrical insulating material. The electroconductive members embedded are mutually electrically insulated.

One end of the electroconductive member is exposed at one surface of the holding member, and the other end exposed at the other surface of the holding member.

Further, the electrical connecting member may consist of one layer or of multiple layers of two or more layers.

(Electroconductive member)

The electroconductive member may be any material which exhibits electrical conductivity. Metal materials are general, but other than metal materials, inorganic materials exhibiting super-conductivity, etc. may be employed.

As the electroconductive member, gold is preferable, but any other desired metal other than gold or alloy can be also used. For example, there may be employed metals or alloys such as Ag, Be, Ca, Mg, Mo, Ni, W, Fe, Ti, In, Ta, Zn, Cu, Al, Sn, Pb—Sn, Pb—Sn—Ag, Pb—Sn—Bi, etc., or a mixture of several kinds of these may be also used.

The metal member and the alloy member may also have the same kind of metal existing as the electroconductive member of the same electrical connecting member, or may also have different kinds of metals existing therein. Further, one of the metal member and the alloy member of the electrical connecting member may be made of the same kind of metal or alloy, or made of a different kind of metal or alloy. Further, other than metals and alloys, provided that it exhibits electroconductivity, a material including one of both or organic materials or inorganic materials in a metal material may be employed.

Further, the sectional shape of the electroconductive member can be made circular, square, ellipsoidal or any other desired shape, but a shape without corner is desirable in order to avoid excessive concentration of stress.

The thickness of the electroconductive member is not particularly limited. In view of the pitch of the connecting portion of the electrical circuit part, it can be freely designed from several microns, $\mu$m, to several tens of $\mu$m.

The exposed portion of the electroconductive member may be made the same surface as the holding member, or may also be protruded from the surface of the holding member. Such protrusion may be on one surface, but also on both surfaces. However, for effecting stable connection with the connecting portion of the electrical circuit part, it should desirably be protruded by several $\mu$m to several tens of $\mu$m from the holding member. Further, when protruded, it may be also shaped as a bump.

The interval between the electroconductive members may be made the same as the interval mutually between the connecting portions of the electrical circuit part, or also narrower than that. When it is made a narrower interval, the electrical circuit part and the electrical connecting member can be connected without requiring registration between the electrical circuit part and the electrical connecting member.

Also, the electroconductive member is not required to be arranged vertically in the holding member, but may be also slanted from one surface side of the holding member toward the other surface side of the holding member.

(Holding member)

The holding member comprises an electrically insulating material.

Any electrically insulating material may be available.

As the electrically insulating material, organic materials, and inorganic materials may be included. Also, metals or alloys applied with the treatment so that the electroconductive members are mutually electrically insulated from each other may be employed Further, one kind or plural kinds of inorganic materials, metal materials, alloy materials with desired shapes such as powder, fiber, rod, sphere, etc. may be dispersed and incorporated in organic materials. Further, one kind or plural kinds of organic materials, metal materials, alloy materials with desired shape such as powder, fiber, etc. may be also dispersed and incorporated in inorganic materials. Also, one kind or two or more kinds of organic materials, inorganic materials with desired shape such as powder, fiber, etc. may be also dispersed and incorporated in metal materials or alloy materials. When the holding member comprises a metal material or an alloy material, for example, an electrically insulating material such as resin, etc. may be imparted to the contact surface with the electroconductive member.

Here, as the organic material, for example, insulating resins may be used, and as the resin, any of thermosetting resins, UV-ray curable resins, thermoplastic resins may be available. For example, there can be used polyimide resin, polyphenylene sulfide resin, polyether sulfone resin, polyether imide resin, polysulfone resin, fluorine resin, polycarbonate resin, polydiphenyl ether resin, polybenzylimidazole resin, polyamideimide resin, polypropylene resin, polyvinyl chloride resin, polystyrene resin, methyl methacrylate resin, polyphenylene oxide resin, phenol resin, melamine resin, epoxy resin, urea resin, methacrylic resin, vinylidene chloride resin, alkyd resin, silicone resin and other resins. Also, these resins may be resins exhibiting photosensitivity such as posi, nega, etc.

If a resin with good thermal conductivity is used from among these resins, even if the semiconductor element may have heat, the heat can be dissipated through the resin, and therefore it is more preferable. Further, if one having the thermal expansion ratio which is the same as or similar to the circuit substrate is chosen as the resin, and at least one hole or a plurality of air bubbles may be permitted to exist in the organic material, it becomes possible to further prevent lowering of reliability of the electrical circuit device based on the thermal expansion-thermal shrinkage.

As the inorganic material, metal material to be contained, for example, there may be employed inorganic materials, including ceramics such as $SiO_2$, $B_2O_3$, $Al_2O_3$, $Na_2O$, $K_2O$, CaO, ZnO, BaO, PbO, $Sb_2O_3$, $As_2O_3$, $La_2O_3$, $ZrO_2$, BaO, $P_2O_5$, $TiO_2$, MgO, SiC, BeO, BP, BN, AlN, BC, TaC, $TiB_2$, $CrB_2$, TiN, $Si_3N_4$, $Ta_2O_5$, BaC, etc., diamond, glass, carbon, boron, etc., and metals or alloys such as Ag, Cu, Au, Al, Be, Ca, Mg, Mo, Fe, Ni, Si, Co, Mn, W, Cr, Nb, Zr, Ti, Ta, Zn, Sn, Pb—Sn, etc.

(Connection)

For connection between the electrical connecting member and the connecting portion of the electrical circuit part, the following 4 constitutions may be conceivable.

To each surface of one electrical connecting member, one, two or more electrical circuit parts may be also connected, and at least one of the electrical circuit parts connected may be connected according to the constitution shown below.

(1) The constitution, in which one end of a plurality of electroconductive members exposed at one surface of the holding member and the connecting portion of one electrical circuit part, and also the other end of a plurality of electroconductive members exposed on the other surface of the holding member and the connecting portion of the other electrical circuit part are, respectively, connected according to the method other than the metallization and/or alloy formation as described in the following (2) to (4).

(2) The constitution, in which at least one end of a plurality of electroconductive members exposed at one surface of the holding member and at least one connecting portion of one electrical circuit part are connected by metallization and/or alloy formation, while the other end of a plurality of electroconductive members exposed at the other surface of the holding member and the connecting portion of the other electrical circuit part are connected according to the method other than metallization and/or alloy formation.

(3) The constitution, in which one end of the electroconductive members exposed at one surface of the holding member and the connecting portion of one electrical circuit part are connected according to the method other than metallization and/or alloy formation, while at least one other end of a plurality of electroconductive members exposed at the other surface of the holding member and at least one connecting portion of the other electrical circuit part are connected by metallization and/or alloy formation.

(4) The constitution, in which at least one end of a plurality of electroconductive members exposed at one surface of the holding member and at least one of the connecting portion of one electrical circuit part are connected by metallization and/or alloy formation, while at least one other end of a plurality of electrical circuit parts exposed at the other surface of the holding member and at least one of the connecting portions of the other electrical circuit part are connected by metallization and/or alloy formation.

Next, of the above connections, connection by metallization and/or alloy formation is described.

When the electroconductive member and the connecting portion to be connected comprise the same kind of pure metal, the connected body formed by metallization will have a crystalline structure of the same kind as the electroconductive member or the connecting portion. As the method for metallization, for example, the end of the electroconductive member is brought into contact with the connecting portion corresponding to that end, and then heated to a suitable temperature. By heating, diffusion of atoms, etc. occurs in the vicinity of the connecting portion, and the diffused portion becomes a metallized state to form a connected body.

When the electroconductive member and the connecting portion to be connected comprise different kinds of pure metals, the connected body formed comprises an alloy of the both metals. As the method for alloy formation, for example, the end of the electroconductive member may be brought into contact with the connecting portion corresponding to that end, and then heated to a suitable temperature. By heating, diffusion of atoms, etc. occurs in the vicinity of the contacted portion to form a layer comprising a solid solution or an intermetallic compound, which layer becomes a connected body.

When Au is employed for the electroconductive member and Al for the connecting portion of the electrical circuit part, a heating temperature of 200° to 350° C. is preferable.

When one of the electroconductive member and the connecting portion to be connected comprises a pure metal and the other an alloy, or both comprise the same kind or different kinds of alloys, the connected body becomes an alloy.

To observe as plurality of electroconductive members in one electrical connecting member, there are the case when the respective electroconductive members comprise the same kind of a metal or an alloy, the case when the respective members comprise different kinds of metals or alloys, or further the case when one electroconductive member comprises the same kind of a metal or an alloy, different kinds of metals or alloys, and others, but in either case, the above-mentioned metallization or alloy formation takes place. On the other hand, the same is the case with the connecting portion.

The electroconductive member or the connecting portion may be a metal or an alloy at the connecting portion of the both, but other portions may be under the state of, for example, a metal formulated with glass, a metal formulated with a resin.

For enhancing the connection strength, it is preferable to make smaller the surface roughness of the portion to be connected (particularly preferably 0.3 $\mu$m or less). Also, on the surface of the portion to be connected, a plating layer comprising a metal susceptible to alloy formation or an alloy may be provided.

For effecting connection other than metallization or alloy formation as described above, for example, the connecting portion of the electrical circuit part and the electroconductive member of the electrical connecting member exposed are pressure contacted by pressing the electrical circuit part.

Also, when the electrical circuit part and the electrical connecting member are pressurized, the adhesive interposed therebetween is cured to give rise to a compressive force between the electrical circuit part and the electrical connecting member through the curing shrinkage force of said adhesive, by which compressive force the connecting portion of the electrical circuit part and the electroconductive member exposed are connected.

(Adhesive)

The adhesive comprises an electrically insulating material.

As the adhesive, thermosetting resins, thermoplastic resins, UV-ray curable resins are included. Also, these resins may be mixed.

As the resin which is the base for these adhesives, there may be included epoxy type resin, acrylic resin, phenolic resin, silicone type resin, polyamide-imide type resin, SBR, EVA, polyester type, polyallylate, urea type resin, melamine type resin, vinyl acetate type resin, cyanoacrylate, vinyl acetate acrylic resin emulsion, polyurethane type resorcinol type, polyatic type, polyvinyl alcohol type, polyvinyl acetal type, vinyl chloride type, acrylic type, polyethylene type, cellulose type, other polyisobutylene, polyvinyl ether, or synthetic rubber type adhesive may be also employed.

As the function of these adhesives, there are the function of pressing the electroconductive member and the connecting portion of the electrical circuit part through the shrinking force during curing to effect electrical connection and the function of mechanical connection for holding the electrical circuit part.

As the method for curing these adhesives, it may be practiced by heating or by UV-ray.

As the substrate in forming the electrical connecting member, thin plates of metals or alloys such as Cu, Au, Ag, Be, Ca, Mg, Mo, Ni, W, Fe, Ti, In, Ta, Zn, Al, Sn, Pb—Sn, etc can be used. However, since only the substrate is selectively etched away in the final step, it is necessary to make the material used for the substrate different from that of the electroconductive member.

As the electroconductive particles constituting said anisotropic electroconductive film, gold particles or particles having metal particle layer on the surface of electrically insulating particles can be used.

Also, the present invention is very effective for the case wherein the electrical circuit parts having connecting portions are mutually connected, particularly the electrical circuit member for which connection with narrow pitch is demanded, the electrical circuit member for which connection with low resistance value is demanded for good electrical characteristics, for example, flowing current, the electrical circuit member for which connection of electrical circuit parts with the connecting portions being concave-shaped is demanded, the electrical circuit member for which connection of electrical circuit members with low connection temperature during bonding is demanded, and can be applied to semiconductor parts, semiconductor devices, also to thermal recording parts and devices such as ink jet head, thermal head, etc. which uses flying ink with the bubbles generated by giving thermal energy to ink, and further to LED array, contact sensor, liquid crystal display parts and devices.

Referring now to the drawings, embodiments of the present invention are described.

First, an electrical connecting member 125 is described along with a preparation example of the electrical connecting member 125.

FIGS. 24A–24F show a preparation example of the electrical connecting member 125.

Figure 24A:
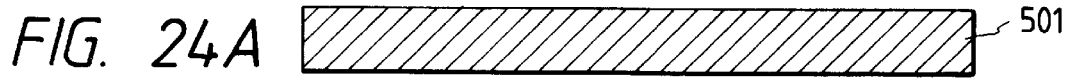
FIG. 24A to 24F are illustrations showing an example of the preparation steps of the electrical connecting member to be used in the present invention.
Figure 24B:
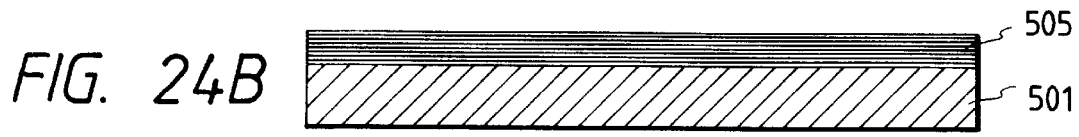
Figure 24C:
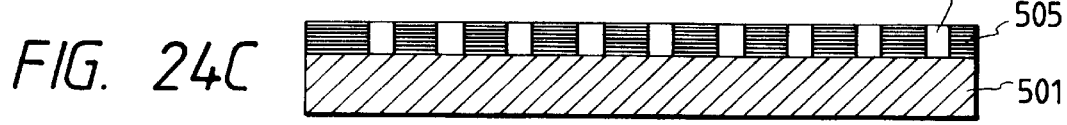

First, a substrate 501 comprising a metal sheet such as copper foil, etc. or a copper plate is prepared (FIG. 24A), and on the substrate 501 is coated an adhesive auxiliary agent by a spin coater and then coated a nega-type photosensitive polyimide resin 505 by a spin coater (spinner), followed by pre-baking at a temperature around 100° C. (FIG. 24B). The film thickness of the polyimide resin 505 coated was made thicker than the desired film thickness of the holding member in the electrical connecting member to be prepared in view of the reduction by dissipation of the solvent and curing shrinkage of the resin itself. After irradiation (exposure) of a light on the polyimide resin 505 through a photomask (not shown) with a predetermined pattern, developing was carried out. In this case, it is preferable to set the energy density of the light irradiated at 100 to 10,000 mJ/cm$^2$ and carry out the development for 4 to 30 minutes. At the portion exposed, the polyimide resin remains, while the polyimide resin was removed by the developing processing at the unexposed portion to form a plurality of holes 142 of about 10 to 20 nm in diameter (FIG. 24C). The temperature was raised up to 200° to 400° C. to effect curing of the polyimide resin 505.

Meanwhile, even when adequate exposure conditions and developing conditions may be set, the residue of the polyimide resin 35a (not shown) may sometimes remain on the surface of the copper foil 40 at the bottom of the hole 35b. In such case, the dry etching is applied to have the copper plate 40 completely exposed. As the dry etching, for example, O$_2$ plasma etching can be employed, and an example of etching conditions in this case are shown below:

High frequency power: 200 W–400 W
O$_2$ flow rate: 200 SCCM
Pressure: 1 Torr
Etching time: 5 min.–10 min.

Figure 24D:
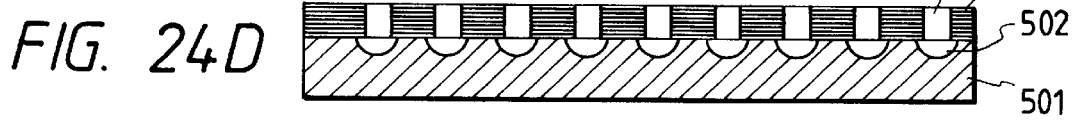
Figure 24E:
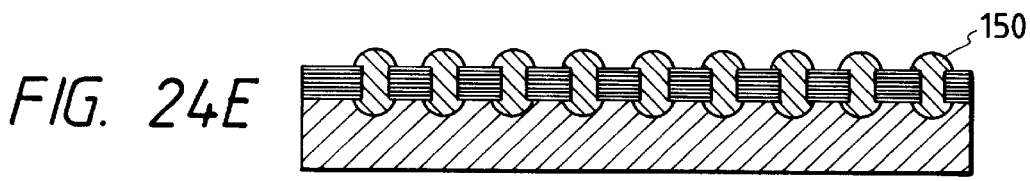
Figure 24F:
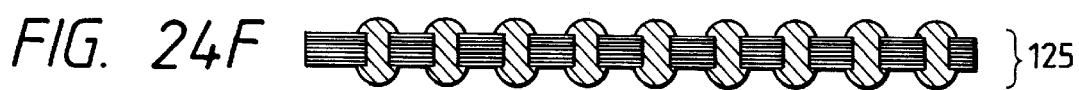

Next, the substrate 501 is dipped in the etchant to effect etching, thereby forming a concavity 502 communicated to the hole 142 on the substrate 501 (FIG. 24D). Next, gold plating is applied with the substrate 501 as the common electrode to fill gold 150 in the hole 142 and the concavity 502, and gold plating was continued until a bump (projected portion) was formed (FIG. 24E). Finally, the substrate 501 was etched away to prepare an electrical connecting member 125 (FIG. 24F).

In the electrical connecting member 125 thus prepared, gold 150 constitutes the electroconductive member, and the polyimide resin 505 constitutes the holding member 111. The dimensions of the respective portions in the electrical connecting member 125 were made about 10 pm for the thickness of the polyimide resin 505 (holding member 111), about 12 μm for the diameter of the hole 142 (diameter of the electroconductive member), about 40 μm for the pitch of said hole and about 5 μm for both front and back of the protruded heights of the electroconductive member.

As the dry etching, in addition to the O$_2$ plasma etching as described above, electron cyclotron resonance (ECR) plasma etching or laser etching by irradiation of excimer laser, etc. may be also employed.

In the step as described above, copper 40 was all removed by metal etching, but a part of the copper other than the place in contact with gold may be also left to be used for reinforcement of the holding member.

In the present embodiment, gold (electroconductive member) was filled by gold plating, but it may be also practiced according to another method such as vapor deposition.

In the present embodiment, the hole was opened by use of photolithography in obtaining the electrical connecting member, but the hole may be also opened by a high energy beam such as excimer laser, etc. In this case, no photosensitive resin is required to be used. Further, the excimer laser may be also irradiated from the resin surface to form a resin hole portion and a copper foil concavity portion.

Next, in the present embodiment, as the anisotropic electroconductive film 2, one commercially available from Sony Chemical K.K. and one from Hitachi Kogyo K.K. were employed.

An example of connecting electrical circuit parts by use of the electrical connecting member formed according to the method as described above is shown below.

Figure 1B:
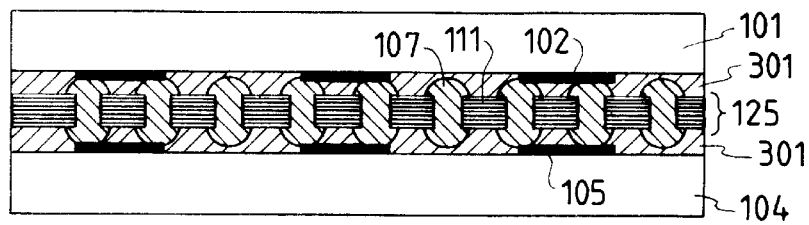

FIGS. 1A and 1B are schematic sectional views showing an embodiment of the electrical circuit member of the present invention. In the sectional view of FIG. 2A, the semiconductor element 101 which is an electrical circuit part, the electrical connecting member 125 having an adhesive 301 provided on both surfaces, and the circuit substrate 104 which is the other electrical circuit part are shown under the state not connected. In the sectional views of the same Figure B, there is shown the state where the connecting portion 102 of the semiconductor element 101 and the connecting portion 105 of the circuit substrate 104 are subjected to registration before connected through the electrical connecting member 125.

Further, in the present embodiment, subsequent to the formation method of the electrical connecting member 125 previously shown, a thermosetting resin with an epoxy resin as the base resin is coated by a roll coater or a spin coater on each surface with electroconductive member of the electrical connecting member 125 being exposed, followed by removal of the solvent by heating to form an adhesive layer (not shown).

Next, as shown in FIG. 1A, the semiconductor element 101, the electrical connecting member 125 having the layers of adhesive 301 provided on both surfaces and the circuit substrate 104 were prepared. The semiconductor element 101, the circuit substrate 104 had a number of connecting portions 102, 105 internally thereof.

The semiconductor element 102 and the circuit substrate 104 were positionally determined so that the relationship between the connecting portion 102 of the semiconductor element 101 and the connecting portion 105 of the circuit substrate 104 may be the same as when connected, and between the respective connecting portions 102, 105 opposed to each other, the electrical connecting member 125 having adhesive layers 301 provided on both surfaces was inserted.

At this time, the electroconductive member 107 was arranged in the holding member 111 so that the size of the portion exposed of the electroconductive member 107 of the electrical connecting member 125 became smaller than the respective interval between the connecting portion 102 of the semiconductor element 101 and the connecting portion 105 of the circuit substrate 104 plus the positional determination precision of the semiconductor element 101 and the circuit substrate 104, and also so that at least one electroconductive member 107 was connected to each connecting portion. By doing so, during connection, by merely determining the positions of the semiconductor element 101 and the circuit substrate 104, connection could be done without effecting positional determination of the electrical connecting member 125.

And, after completion of positional determinations of the semiconductor element 101 and the circuit substrate 104, by pressurizing and heating to 150° to 200° C. the semiconductor element 101 and the circuit substrate 104, the adhesive layers 301 provided on the both surfaces of the electrical connecting member 125 became softened, and the adhesive on the protruded electroconductive member 107 flowed out into between the semiconductor element 101 and the holding member 111 and between the circuit substrate 104 and the holding member 111, whereby the electroconductive member 107 came into contact with the respective connecting portions 102, 105, and further the epoxy resin adhered the semiconductor element 101 with the electrical connecting member 125, and the circuit substrate 104 with the electrical connecting member 125. At this time, through the curing shrinkage reaction of the epoxy resin, the electroconductive member 107 and the respective connecting portions 102, 105 were maintained under constantly contacted state to maintain electrical connection (FIG. 1B).

Figure 2A:
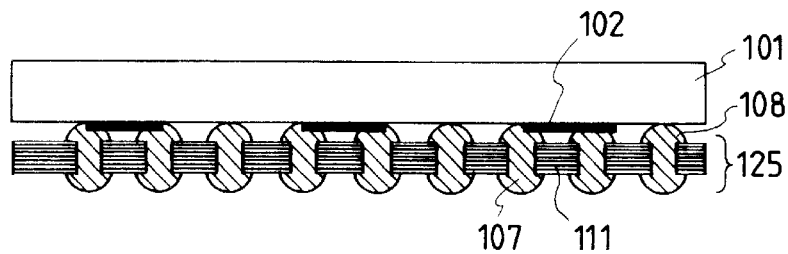
FIG. 2A to 2C are schematic sectional views of another embodiment showing the connection relationship of electrical circuit parts.
Figure 2B:
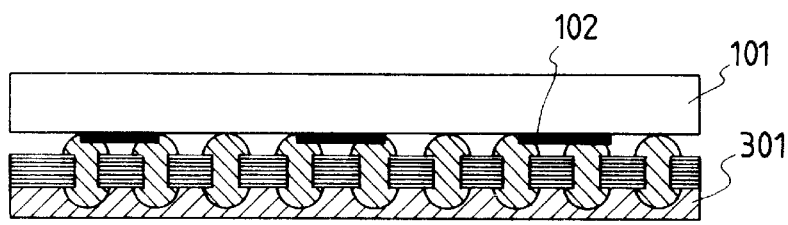
Figure 2C:
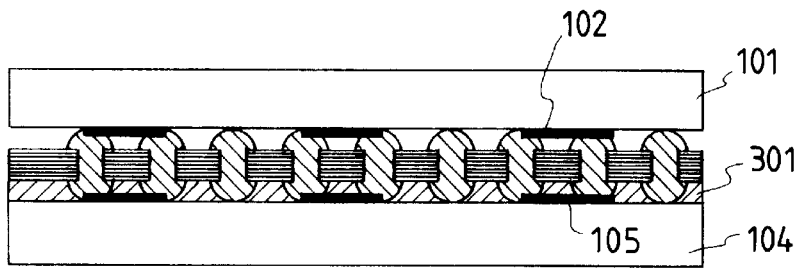

FIGS. 2A–2C are schematic sectional views showing another embodiment of a circuit device connected with an adhesive.

In the present embodiment, first the connecting portion 102 of the semiconductor element 101 and the electroconductive member 107 of the electrical connecting member 125 were connected by hot pressure adhesion at a temperature of 200° to 350 ° C. (FIG. 2A).

At this time, Al constituting the connecting potion 102 of the semiconductor element 101 and Au constituting the electroconductive member 107 were connected by metallization and/or alloy formation. Also, since the electroconductive member was arranged as described in the foregoing embodiment, connection could be done without requiring positional determination of the connecting portion 102 of the semiconductor element 101 and the electroconductive member 107. Also, with the arrangement of the electroconductive member 107 being made the same as the connecting portion 102 of the semiconductor element 101, the electroconductive member 107 and the connecting portion 102 of the semiconductor element 101 may be connected with positional determination.

Next, an adhesive 301 is coated on the electrical connecting member 125 connected to the semiconductor element 101 at the non-connected surface (FIG. 2B). For the adhesive 301, a UV-ray curable type was employed.

The adhesive may be coated by way of dipping or coated by spraying of a solution dissolved in a solvent. In the present embodiment, since the semiconductor element 101 is connected to the electrical connecting member 125, handling is extremely good even in such step, and also since the electrical connecting member 125 can be formed into a tape and a plurality of semiconductor elements can be connected thereto, automation and continuation of the steps can be easily done.

Next, a glass substrate 104 which is a circuit substrate is prepared, and after positional determination so that the connecting portion 105 and the connecting portion 102 of the semiconductor element 101 may become a positional relationship opposed to each other, UV-ray was irradiated from the glass substrate side under pressurization. The adhesive 301 on the protruded electroconductive member was pushed away by pressurization, and said electroconductive member came into contact with the connecting portion of the glass substrate 104. Also, the adhesive 301 adhered the electrical connecting member 125 to the glass substrate 104 irradiated by UV-ray, and through the curing shrinkage reaction at that time, the electroconductive member and the connecting portion 105 of the glass substrate could maintain more stable contact state, whereby the semiconductor element 101 and the glass substrate 104 could be electrically connected (FIG. 2C).

Also, by heating thereafter to 100° to 200° C., connection with further increased and stabilized adhesive force could be obtained.

Figure 3A:
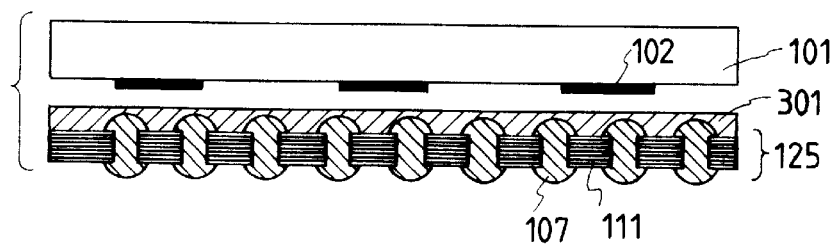
FIG. 3A to 3C are schematic sectional views of another embodiment showing the connection relationship of electrical circuit parts.
Figure 3B:
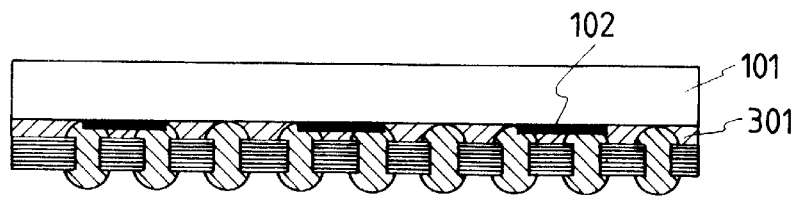
Figure 3C:
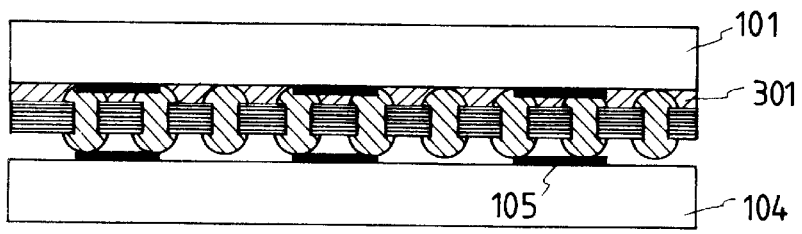

FIGS. 3A to 3C are schematic sectional views showing another embodiment of the connecting method of electrical circuit parts and an electrical circuit member connected.

In the present embodiment, first a semiconductor element 101 and an electrical connecting member 125 having an adhesive 301 on one surface were prepared (FIG. 3A).

Next, by pressure adhesion of these by heating at 100° to 200° C., the electroconductive member 107 and the connecting portion 102 of the semiconductor element 101 were connected (FIG. 3B).

Next, the connecting portion 105 of the circuit substrate 104 and the connecting portion 102 of the semiconductor element 101 were positionally determined so as to be opposed to each other, and then pressurized to be connected (FIG. 3C). At this time, by means of an implement (not shown) by use of spring, screw, etc. so as to apply continuously a pressurization force, the semiconductor element 101 and the circuit substrate 104 were pressurized.

In the present embodiment, since the interval between the electroconductive member is connected by the pressurizing force of spring, screw, etc., when a defect is generated, it becomes possible to exchange quickly only the defective part, and also since the electrical connecting member 125 is connected to one of the electrical circuit parts, connection could be done easily without increasing the number of parts during connection.

Also, the adhesive 301 provided on one surface of the electrical connecting member 125 has the same effect even when provided on the circuit substrate side.

Figure 4A:
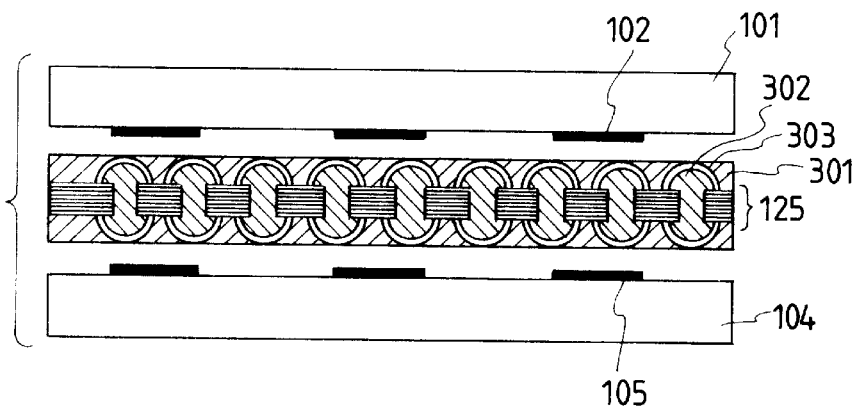
FIG. 4A and 4B are schematic sectional views of another embodiment showing the connection relationship of electrical circuit parts.
Figure 4B:
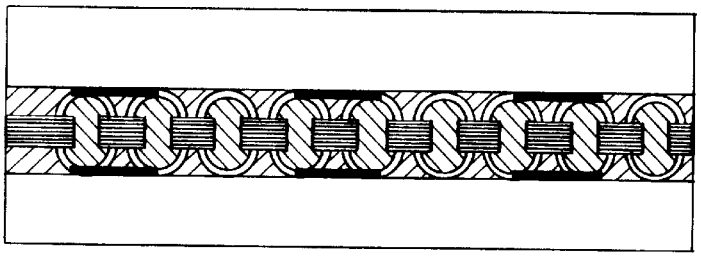

FIGS. 4A and 4B are schematic sectional views showing another embodiment of the connecting method of electrical circuit parts and the electrical circuit member connected.

In the present embodiment, an electrical connecting member 125 having an Ni layer 302 and a solder layer 303 for diffusion prevention provided on the protruded surface of the electroconductive member was employed. During preparation of the electrical connecting member, after formation of a concavity on the substrate 501 in FIG. 24D, Ni was formed to about 1 μm by electroplating so as to cover the concave surface, and further Au plating effected to form a protruded bump of Au on the opposite surface, and then again an Ni layer of about 1 μm was formed by Ni plating so as to cover the bump surface, followed by removal of the substrate 501. Next, the electrical connecting member was dipped in a solder tank, to form a solder layer only on the protruded bump portion.

As another preparation method, there is also the method in which a solder layer is formed by electroplating before formation of the concave Ni layer on the above substrate 501, then the Ni layer is formed, Au plating is effected, the Ni layer is formed and the solder layer is formed, followed by removal of the substrate 501 to obtain the electrical connecting member.

Next, on the surface of the electrical connecting member was formed an adhesive by transfer. This was practiced by coating an adhesive on a separator (silicon-treated polyester film), plastering the adhesive surface to the electrical connecting member, and removing the separator to have the adhesive transferred onto the electrical connecting member.

Positional determination was done so that the positional relationship between the connecting portion 102 of the circuit substrate 101 and the connecting portion 105 of the circuit substrate 104 was opposed to each other, and also the above electrical connecting member was inserted therebetween (FIG. 4A).

Next, by heating and pressurizing the circuit substrate 101 and the circuit substrate 104 to 100° to 200° C., the metals forming the solder layer on the surface of the electroconductive member and the respective connecting portions 102, 105 form an alloy to be connected, with the portions other than the connecting portions being adhered with an adhesive (FIG. 4B).

In the present embodiment, connection was effected between two circuit substrates, but according to the same method, it is also possible to effect connection between the outer lead of a semiconductor element package and the circuit substrate or between the outer lead of TAB package and the circuit substrate.

FIGS. 5A and 5B, FIGS. 6A to 6C, FIGS. 7A to 7C, FIGS. 8A to 8C are schematic sectional views showing another embodiment of the present invention.

In the present embodiment, both of one having the adhesive 301 provided on the surface having the connecting portion 102 of the semiconductor element 101 without formation of an adhesive layer on the surface of the electrical connecting member 125 and one having the adhesive 301 provided on the surface having the connecting portion 105 of the circuit substrate 104, or one having the adhesive layer provided on either one of the electrical circuit parts was employed. The semiconductor element 101 and the adhesive layer 301 on the circuit substrate 104 were formed by coating the adhesive with a dispenser.

Figure 5A:
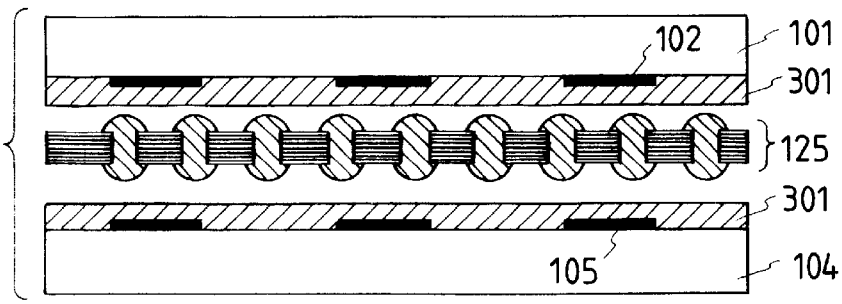
FIG. 5A and 5B are schematic sectional views of another embodiment showing the connection relationship of electrical circuit parts.
Figure 5B:
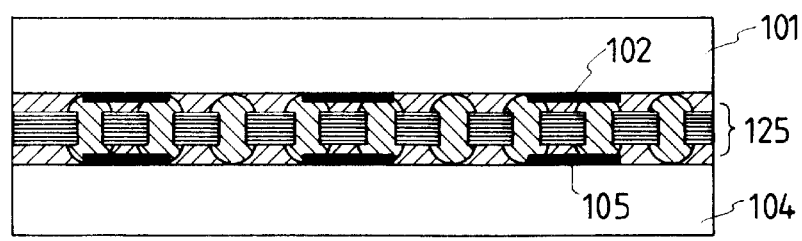
Figure 6A:
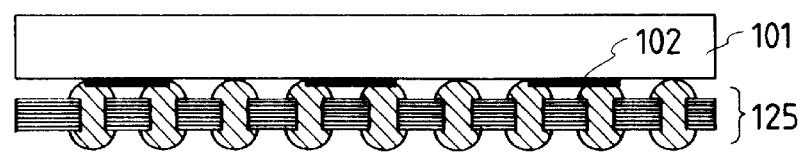
FIG. 6A to 6C are schematic sectional views of another embodiment showing the connection relationship of electrical circuit parts.
Figure 6B:
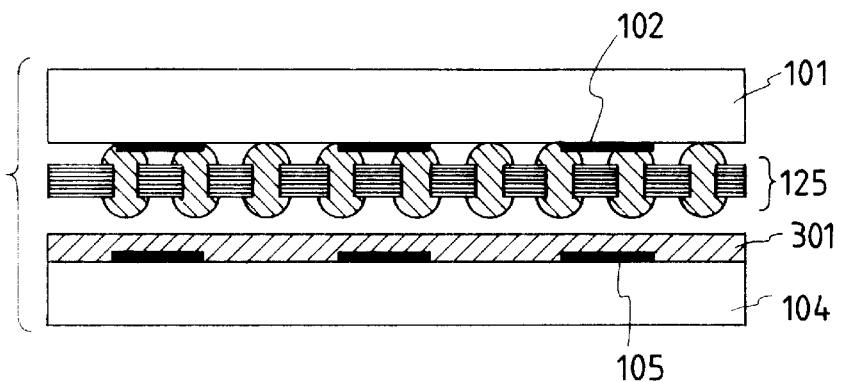
Figure 6C:
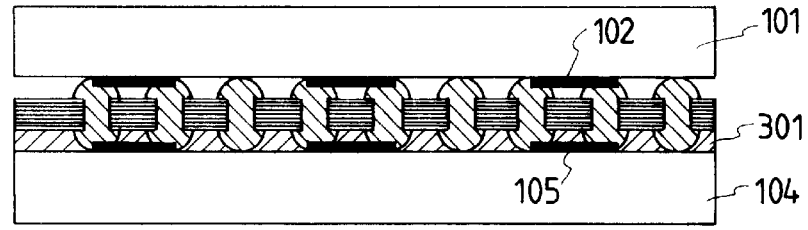
Figure 7A:
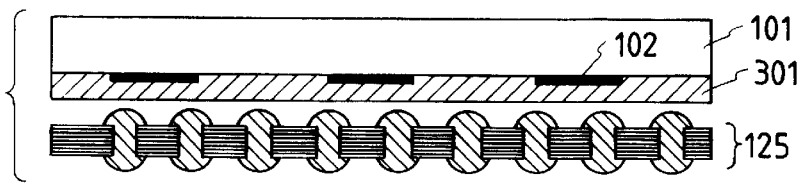
FIG. 7A to 7C are schematic sectional views of another embodiment showing the connection relationship of electrical circuit parts.
Figure 7B:
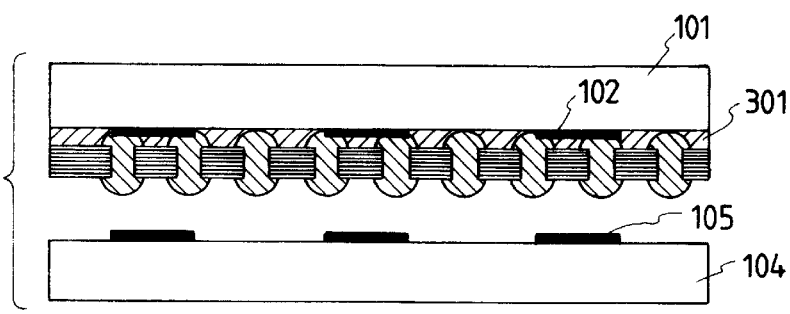
Figure 7C:
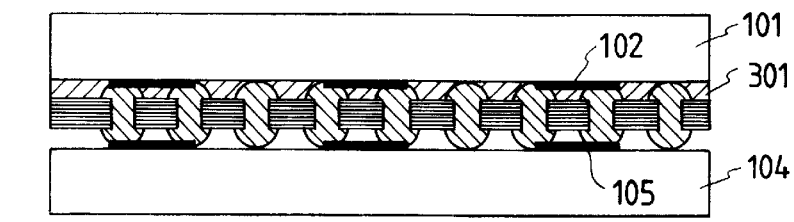

In the case of FIG. 5, one having the adhesive 301 provided on both of the semiconductor element 101 and the circuit substrate 104 and the electrical connectical member 125 were prepared. And, positional determination was done so that the connecting portion 102 of the semiconductor element 101 and the connecting portion 105 of the circuit substrate 104 became the relationship opposed to each other, and also the electrical connecting member 125 was inserted therebetween (FIG. 5A). The subsequent steps were made the same as the first embodiment.

In the case of FIG. 6, one having the adhesive 301 provided only on the circuit substrate 104 was employed. Otherwise, the conditions were made the same as in the embodiments as described above.

In the case of FIG. 7, one having the adhesive 301 provided only on the semiconductor element 101 was employed. Other conditions are the same as in the embodiments as described above.

Figure 8A:
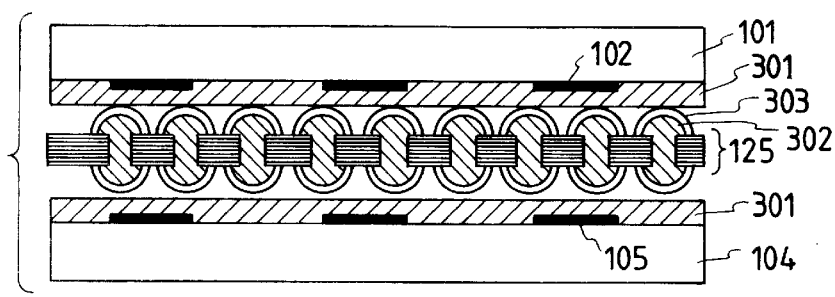
FIG. 8A to 8C are schematic sectional views of another embodiment showing the connection relationship of electrical circuit parts.
Figure 8B:
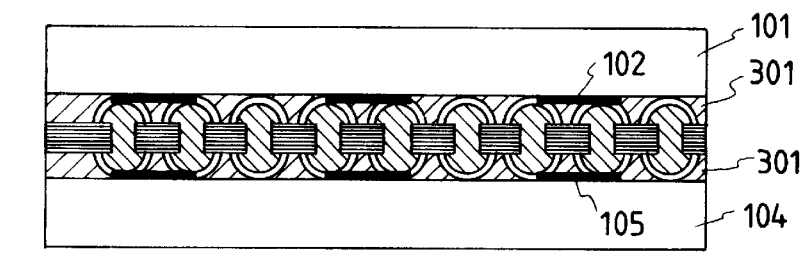
Figure 8C:
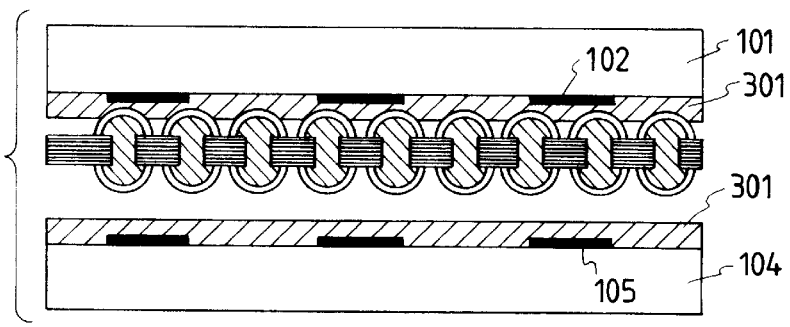

In the case of FIG. 8, one having the adhesive 301 provided on both of the circuit substrate 101 and the circuit substrate 104 was employed. Other conditions were made the same as in the embodiments as described above. When the adhesive has stickiness, as shown in FIG. 8C, the electrical connecting member 125 was tentatively fixed on either one of the electrical circuit parts, and then the electrical circuit parts were mutually positionally determined before being connected.

FIGS. 9A to 9F are schematic sectional views showing another embodiment of the present invention.

The present embodiment aims at higher reliability of connection by providing an adhesive on a part of the holding member of the electrical connecting member and permitting no adhesive to exist on the portion where the electroconductive member and the connecting portion of the electrical circuit part are connected.

As the method for forming the adhesive layer on the holding member, the system of transfer shown previously in the previous embodiment was employed, and at this time the adhesive was formed on a separator at the desired position and in shape by masking. And, under pressurization while effecting registration with the electrical connecting member, the adhesive 301 was transferred onto the holding member.

And, positional determination was effected so that the connecting portion 102 of the semiconductor element 101 and the connecting portion 105 of the circuit substrate 104 were opposed to each other, and also the above electrical connecting member was inserted therebetween (FIG. 9A).

And, by heating and pressurizing the semiconductor element 101 and the circuit substrate 104 to 100° to 200° C., the adhesive was cured to adhere the semiconductor element 101 to the electrical connecting member, and the circuit substrate 104 to the electrical connecting member (FIG. 9B). By the curing shrinkage reaction at this time, the respective connecting portions and the electroconductive member maintained the state pressurized to be electrically connected. In the present embodiment, since no adhesive exists at all between the connecting portion and the electroconductive member, an extremely stable contact could be obtained and high electrical reliability could be obtained.

FIG. 9C shows that the connecting portion 102 of the semiconductor element was connected to the electroconductive member by thermal pressure adhesion similarly as in the second embodiment, and the adhesive 301 was provided on the surface on the opposite side to the electrical connecting member to effect connection to the circuit substrate 104.

FIG. 9D is the same as in the third embodiment except for providing the adhesive only on a part of the holding member as described above.

FIGS. 9E and 9F are the same as in the embodiments as described above except for providing the adhesive layer only on a part of the holding member as described above.

Provision of the adhesive layer is not limited to only a part on the holding member of the electrical connecting member, but it may be also provided on the electrical circuit part side according to the same method as described in the foregoing embodiment.

Further, an adhesive of the two liquid type separated into the main agent and the curing agent may be also made, for example, such that a curing agent is provided on the electrical circuit part side, the main agent on the electrical connecting member side, and the both react with each other when contacted together, pressurized and heated.

Next, the embodiments having electrical circuit parts connected by use of an electrical connecting member and an anisotropic electroconductive film are described.

Figure 10A:
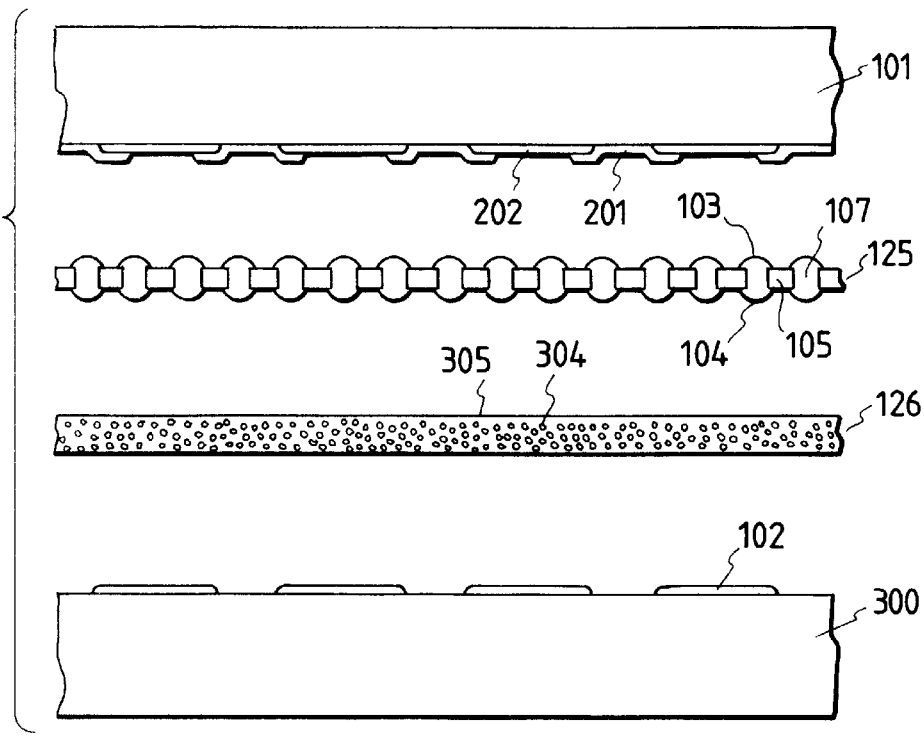
FIG. 10A and 10B are schematic sectional views of another embodiment showing the connection relationship of electrical circuit parts.

In FIG. 10, the electrical connecting member 125 is constituted of a plurality of electroconductive members 107 made of gold provided in the holding member 105 comprising a polyimide with the respective electroconductive members 107 mutually electrically insulated from one another, and one end 103 of the electroconductive member 107 is exposed on the semiconductor element 101 side which is the electrical circuit part, with the other end 104 of the electroconductive member 107 being exposed on the circuit substrate 300 side which is the electrical circuit part. On the other hand, one surface of the anisotropic electroconductive film 126 is exposed on the other end 104 side of the electroconductive member 107 of the electrical connecting member 1, while the other surface of said anisotropic electroconductive film 126 is exposed on the circuit substrate 300 side which is the electrical circuit part.

Figure 10B:
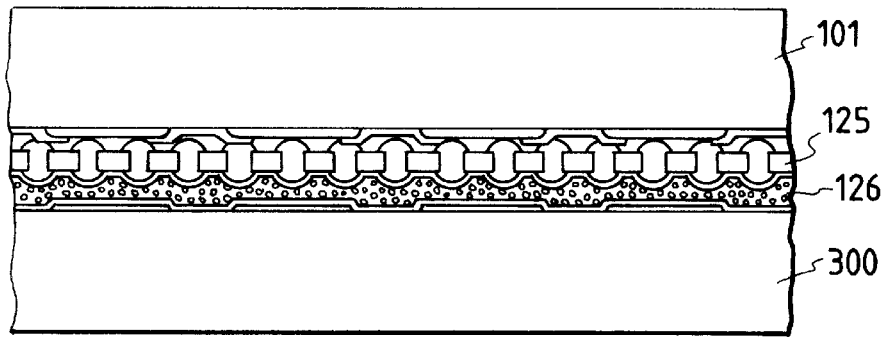

And, the concave-shaped connecting portion 102 of Al covered with no passivation film 201 of the semiconductor element 101 and one end 103 of the electroconductive member 107 which is Au of the electrical connecting member 125 exposed on the semiconductor element 101 side are electrically connected, and further one end 104 of the electroconductive member 107 which is Au of the electrical connecting member 125 exposed on the anisotropic electroconductive film 126 side and the metal particles 305 which is Ni powder dispersed in the electrically insulating adhesive 304 of the anisotropic electroconductive film 126 are electrically connected, and further the metal particles 305 which are Ni powder of the anisotropic electroconductive film 126 and the connecting member 102 gold plated on the copper pattern of the circuit substrate 300 were electrically connected (FIG. 10B). In the present embodiment, electrical connection was effected with screw and spring pressing, but pressing can be effected according to other known methods.

Although the positional determination of the semiconductor element 101 and the circuit substrate 300 is necessary, because the electroconductive member 107 of the electrical connecting member 125 is smaller than the pitch of the connecting portion 102 of the semiconductor element 101, and the metal particles 305 of the anisotropic electroconductive film 126 are uniformly dispersed, the positional determination of the electrical connecting member 125 and the anisotropic electroconductive film 126 may be not so precise.

In the case of the present embodiment, the semiconductor element 101 and the circuit substrate 300 were connected temporarily by use of the electrical connecting member 125 and the anisotropic electroconductive film 126, but the semiconductor element 101 and the electrical connecting member 125 may be also connected, and the circuit substrate 300 and the anisotropic electroconductive film 126 connected before connection of the electrical connecting member 125 and the anisotropic electroconductive film 126.

According to the present embodiment as described above, an electrical circuit member with good connection reliability and low cost could be obtained.

Figure 11A:
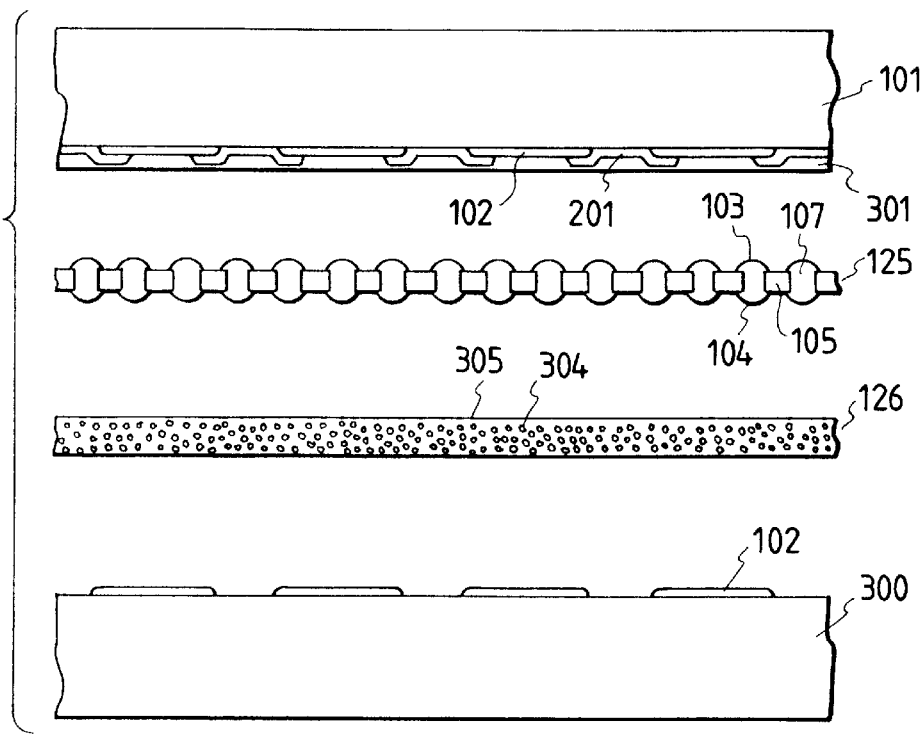
FIG. 11A and 11B are schematic sectional views of another embodiment showing the connection relationship of electrical circuit parts.
Figure 11B:
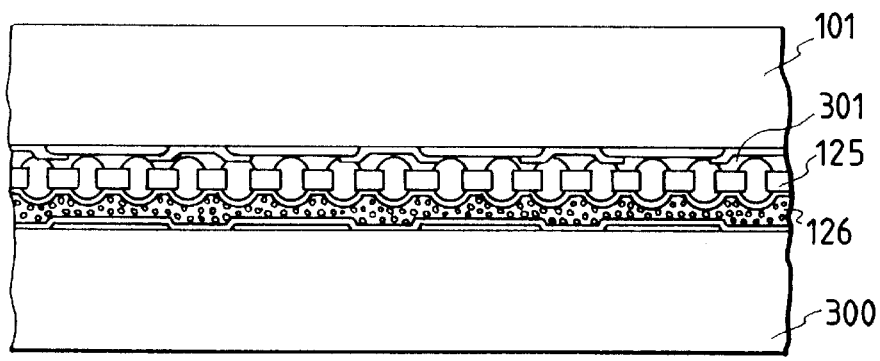

FIGS. 11A and 11B are schematic views showing another embodiment of the present invention which effects electrical connection with an electrical connecting member and an anisotropic electroconductive film interposed between electrical circuit parts. FIG. 11A shows the state before electrical connection, and FIG. 11B the state after electrical connection.

This embodiment is the same as the previous embodiment except for adhering the semiconductor element 101 and the electrical connecting member 125 by use of the adhesive 301, thereby effecting electrical connection between the connecting portion 102 of the semiconductor element 101 and the electroconductive member 107 of the electrical connecting member 125.

The method of adhering the semiconductor element 101 and the electrical connecting member 125 to effect electrical connection between the connecting portion 102 of the semiconductor element 101 and the electroconductive member 107 of the electrical connecting member 125 was conducted according to the method as described below.

That is on the whole surface or partially of the passivation film 201 of the semiconductor element 101 and the connecting portion 102 was coated an epoxy type adhesive 301 by use of a dispenser. With the electrical connecting member 125 mounted on the coating, said electrical connecting member was pressed with a flat glass (not shown), heated at 100° to 200° C. to cure the epoxy type adhesive 301, and the semiconductor element 101 and the electrical connecting member 125 were adhered simultaneously with electrical connection of the connecting portion 102 of the semiconductor element 101 with one end 103 of the electroconductive member 107 of the electrical connecting member 125. By doing so, the adhesive resin will be shrinked when cured, and therefore the same state as under pressing can be obtained even after the glass was taken away, thereby contributing to maintenance of the electrical connection. Then, with the anisotropic electroconductive film 126 interposed between the other end 104 of the electroconductive member 107 of the electrical connecting member 1 and the circuit substrate 300, pressurization, heating were effected to connect electrically the connecting portion 102 of the semiconductor element 101 to the connecting portion 102 of the circuit substrate 300.

The adhesive to be used in the present embodiment is not limited to epoxy type adhesives, but adhesives shown in the previous embodiments may be also used.

In the present embodiment, the amount of the adhesive coated was more than the volume of the gap portion between the semiconductor element 101 and the electrical connecting member 125, with the superfluous adhesive filled sufficiently in the gap portion being bulged out, but an amount equal to or less than the volume of the gap portion may be also coated.

Also, in the present embodiment, the semiconductor element 101 and the electrical connecting member 125 were adhered, and the adhering portion 102 of the semiconductor element 101 and the electroconductive member 107 of the electrical connecting member 125 were connected before effecting connection by interposing the anisotropic electroconductive film 126 between the circuit substrates 300, but connection between the electrical connecting member 125 and the semiconductor element 101 may be also effected after connection of the circuit substrate 300 to the anisotropic electroconductive film 126, the anisotropic electroconductive film 126 to the electrical connecting member 125, or all of them may be connected at the same time, and the order of connection may be any desired one. The adhesive coating method may be a known method such as brush coating, the method by use of a spinner, etc.

According to the present embodiment as described above, an electrical circuit member with good connection reliability and low cost could be obtained.

The embodiment of the present invention shown below is the same except the following points are different from the embodiment as described above.

That is, the electroconductive member 107 of the electrical connecting member 125 was made of solder material, and the material of the connecting portion 102 of the semiconductor element 101 is constituted of Al attached with Cr, Cu, Au materials thereon with the exposed surface being Au.

The connection temperature is 200° to 280° C.

The electrical connecting member 125 and the anisotropic electroconductive film 126 were at the same time pressurized, heated to melt the solder to solder Au and Cu of the connecting portion 102 of the semiconductor element 101, and further solder Ni particles of the anisotropic electroconductive film 126.

Figure 12A:
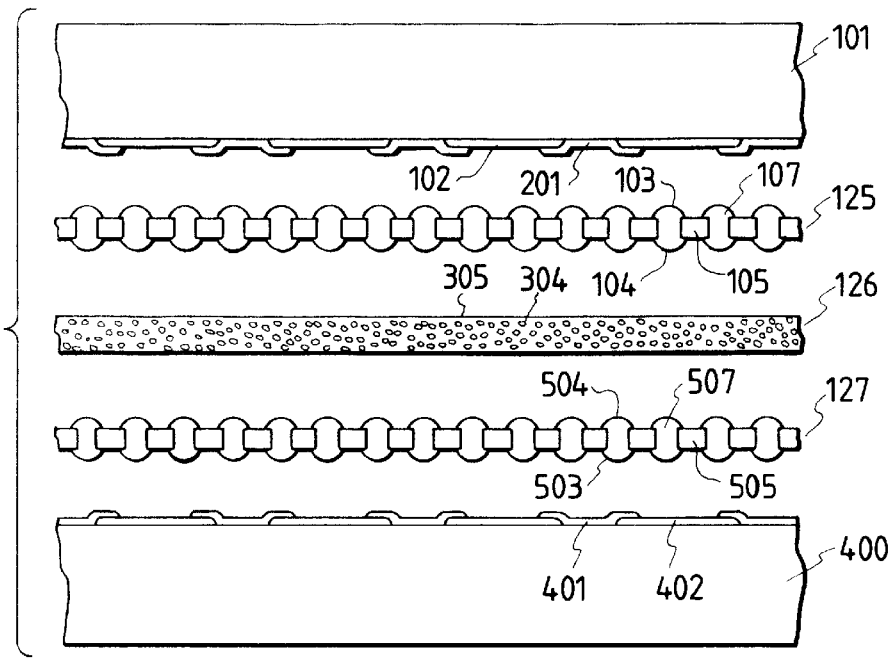
FIG. 12A and 12B are schematic sectional views of another embodiment showing the connection relationship of electrical circuit parts.
Figure 12B:
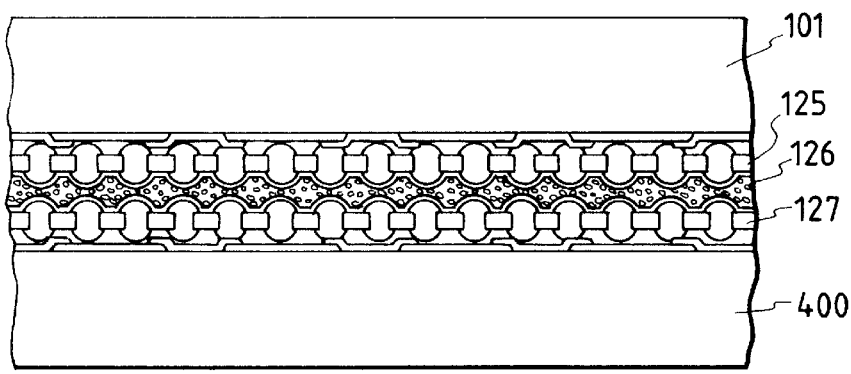

FIGS. 12A and 12B are schematic views showing another embodiment of the present invention, effecting electrical connection by interposing two electrical connecting members and one anisotropic electroconductive film between the electrical circuit parts. FIG. 12A shows the state before electrical connection, and FIG. 2B the state after electrical connection.

The present embodiment is bonding of the semiconductor element 101 which is an electrical circuit part and a semiconductor element 400 which is similarly an electrical circuit part but different in kind from the semiconductor element 101.

The semiconductor element 101 is covered partially at the peripheral portion of the connecting member 102 with a passivation film 201, with the peripheral portion of the connecting portion 102 being convex-shaped and the connecting portion forming a concave shape. Similarly, the semiconductor element 400 is covered partially at the peripheral portion of the connecting portion 402 with a passivation film 401, with the peripheral portion of the connecting portion 402 being convex-shaped and the connecting portion forming a concave shape.

The electrical connecting member 125 was arranged on the semiconductor element 101 side, the electrical connecting member 127 similar to the electrical connecting member 125 arranged on the semiconductor element 400 side, the anisotropic electroconductive film 2 interposed between the electrical connecting members 1, 5, and similarly by pressing as in the previous embodiment, the connecting portion 101 of the semiconductor element 101 and the connecting portion 402 of the semiconductor element 400 were electrically connected.

In the electrical connecting member 127, 505 is a holding member, 507 an electroconductive member, 503 one end of said electroconductive member, and 504 the other end of said electroconductive member.

According to the present embodiment, despite the fact that the connecting portions of the semiconductor elements 101, 400 are concave-shaped, a semiconductor device with good quality reliability could be obtained.

Figure 13A:
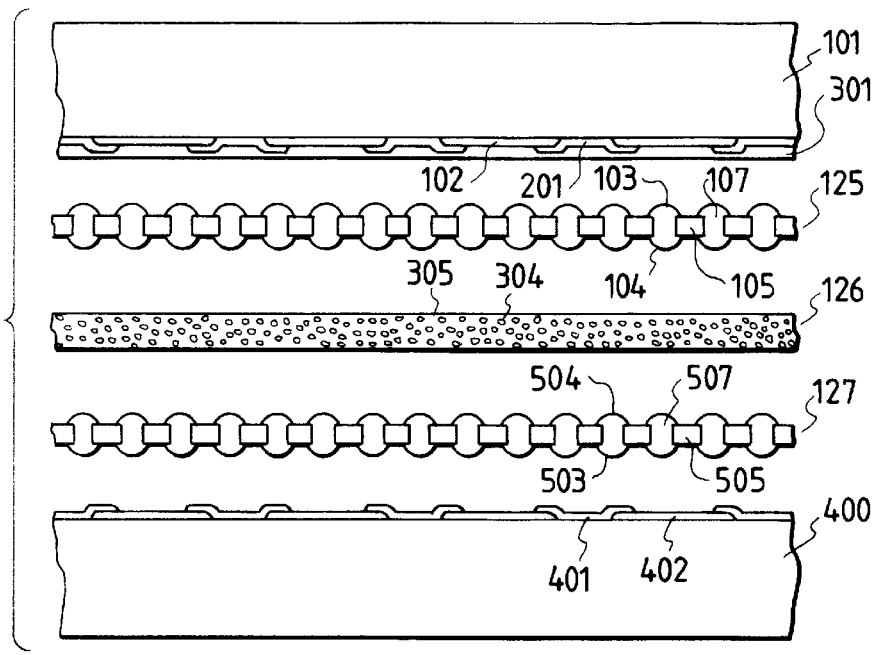
FIG. 13A and 13B are schematic sectional views of another embodiment showing the connection relationship of electrical circuit parts.
Figure 13B:
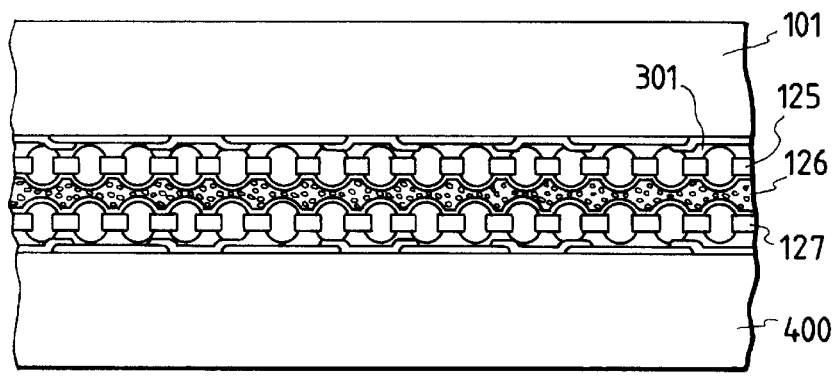
Figure 14:
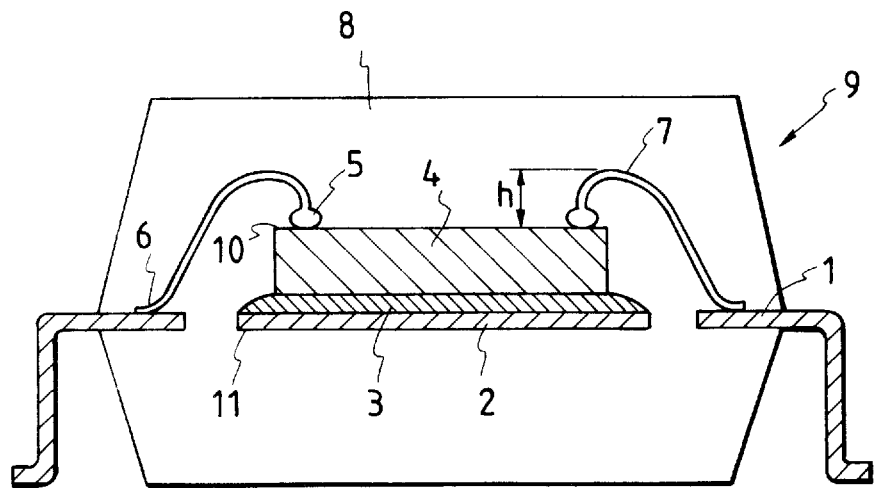
FIG. 14 is an illustration showing a prior art example.
Figure 15:
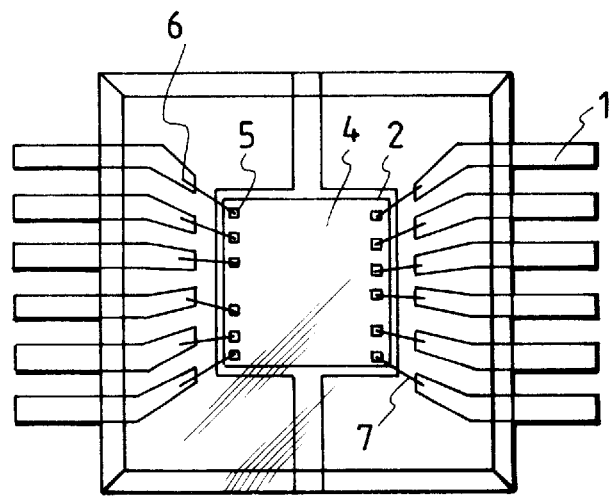
FIG. 15 is an illustration showing a prior art example.
Figure 16:
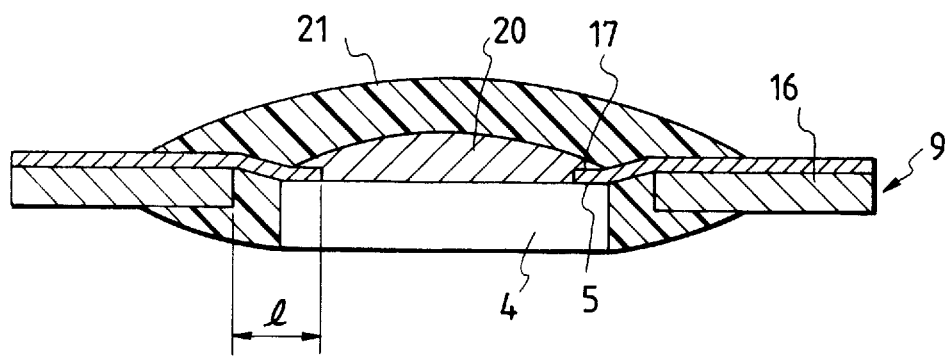
FIG. 16 is an illustration showing a prior art example.
Figure 17:
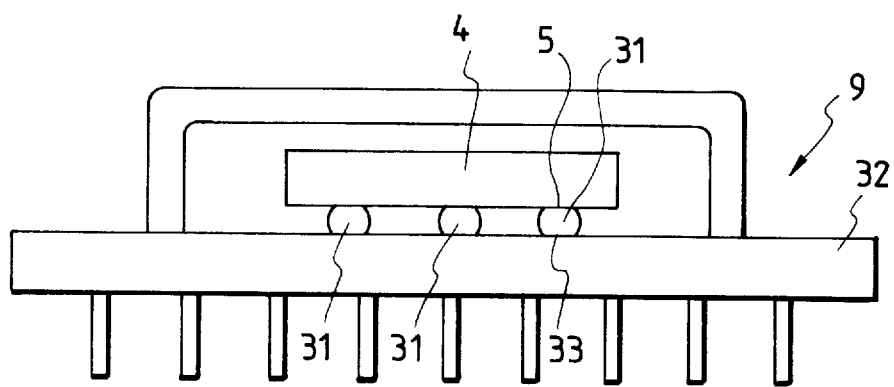
FIG. 17 is an illustration showing a prior art example.
Figure 18:
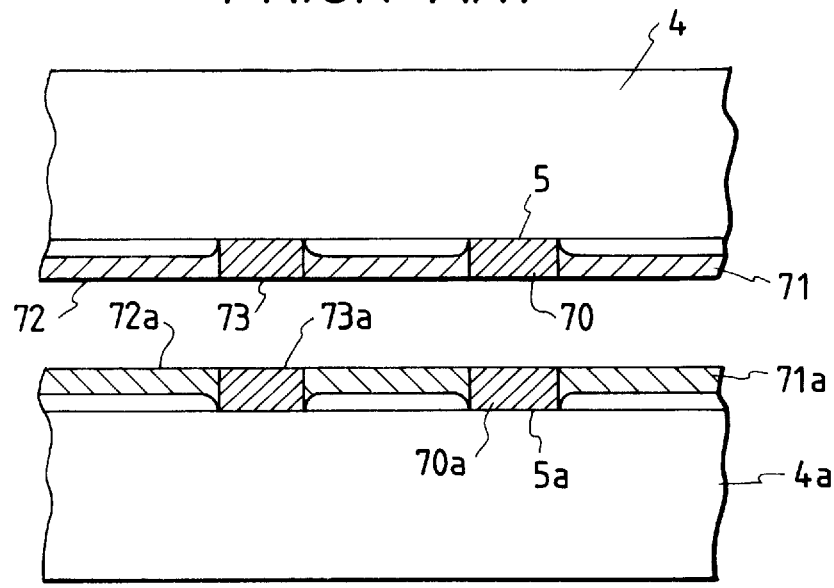
FIG. 18 is an illustration showing a prior art example.
Figure 19:
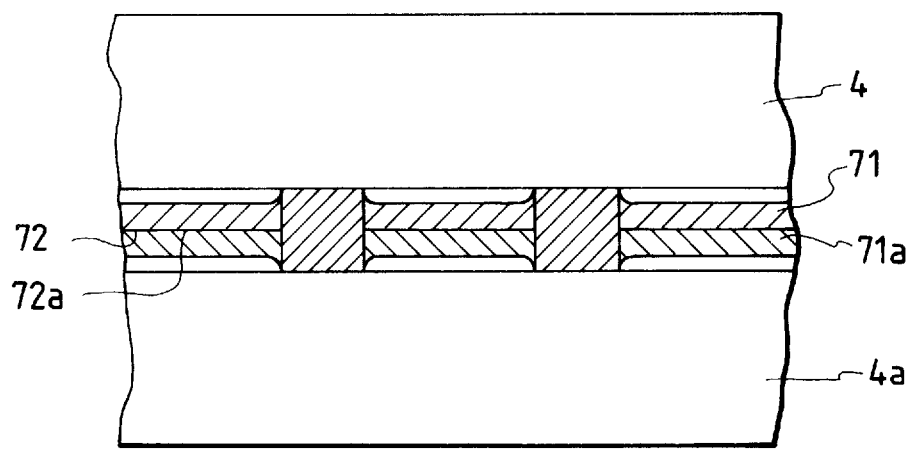
FIG. 19 is an illustration showing a prior art example.
Figure 20A:
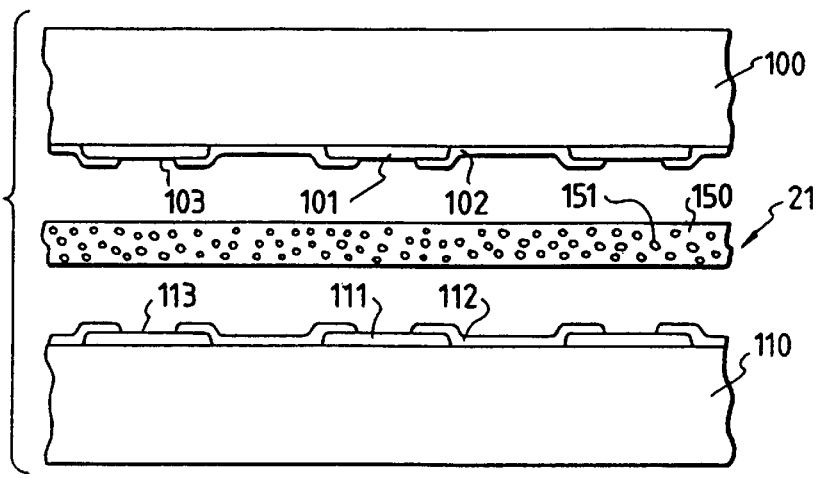
FIG. 20A and 20B are illustrations showing a prior art example.
Figure 20B:
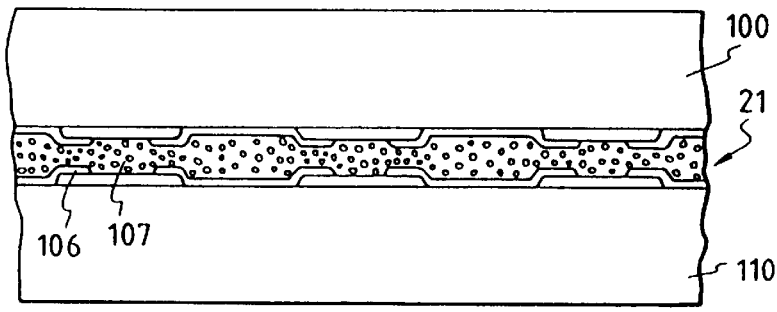
Figure 21:
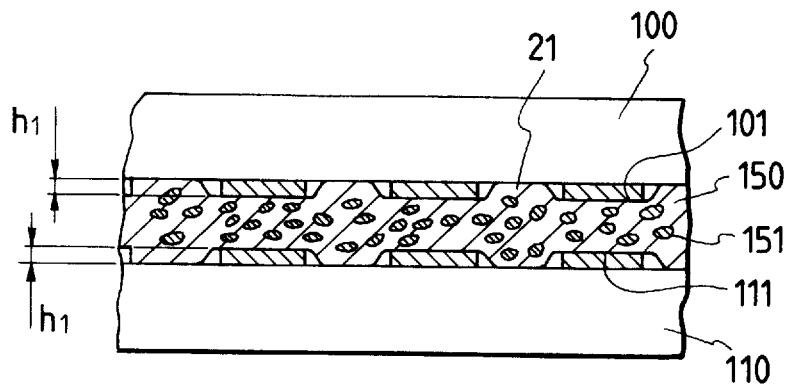
FIG. 21 is an illustration showing a prior art example.
Figure 22:
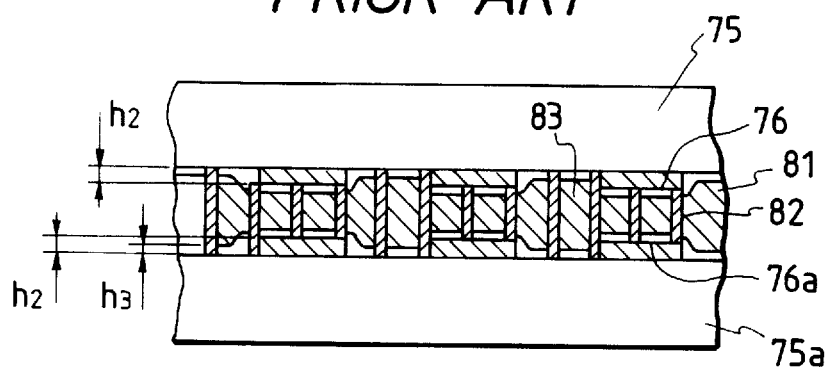
FIG. 22 is an illustration showing a prior art example.
Figure 23A:
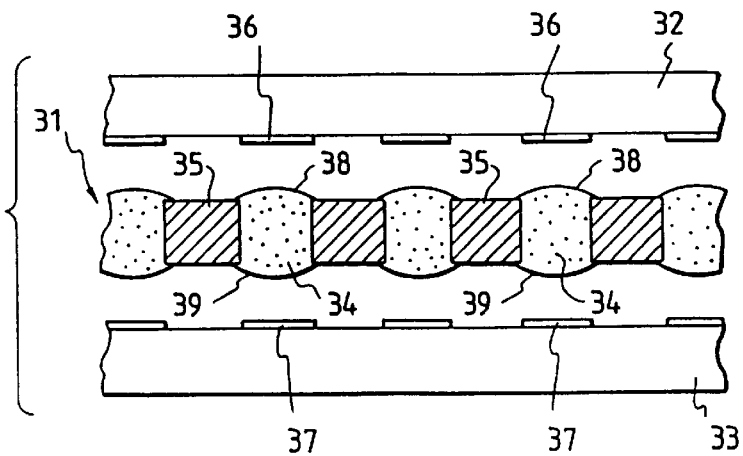
FIG. 23A and 23B are schematic sectional views of a prior art example of an electrical connecting member and the connection relationship thereof.
Figure 23B:
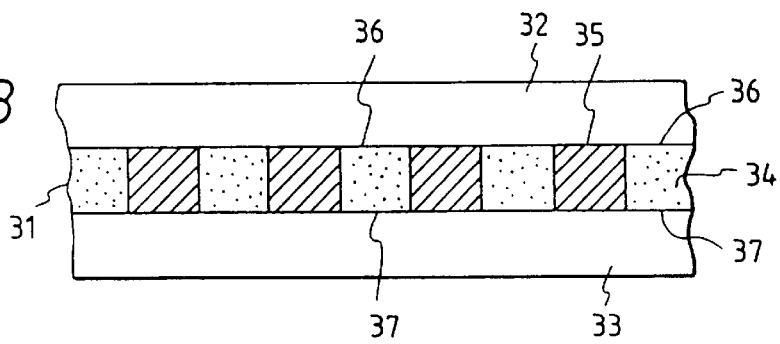

FIGS. 13A and 13B are schematic views showing another embodiment of the present invention, effecting electrical connection by interposing two electrical connecting members and one anisotropic electroconductive film between the electrical circuit parts. FIG. 13A shows the state before electrical connection, and FIG. 13B the state after electrical connection.

In the present embodiment, as the electrical connecting member 125, the same electrical connecting member as used in the previous embodiment was employed, as the electrical connecting member 127, the same electrical connecting member as used in the previous embodiment, and as the anisotropic electroconductive film 126, the same anisotropic electroconductive film as used in the previous embodiment.

As the semiconductor element 101 which is an electrical circuit part and the semiconductor element 400, the same ones as used in the previous embodiment were employed.

In the electrical connecting member 127, 505 is a holding member, 507 an electroconductive member, 503 one end of said electroconductive member, and 504 the other end of said electroconductive member.

According to the same method as used in the previous embodiment, an epoxy type adhesive 301 was coated on substantially all the surfaces of the semiconductor element 101, pressurizing heating effected with the electrical connecting member 125 interposed between the semiconductor element 101 and the glass plate (not shown) to adhere the semiconductor element 101 to the electrical connecting member 125, thereby effecting electrical connection between the connecting portion 102 of the semiconductor element 101 and one end 103 of the electroconductive member 107 of the electrical connecting member 125.

On the other hand, pressurizing heating was effected with the electrical connecting member 127 interposed between the semiconductor element 400 and a glass plate with flat surface (not shown) to have the connecting portion 402 of the semiconductor element 400 soldered with one end 503 of the electroconductive member 507 of the electrical connecting member 127.

Then, the glass plate was removed, and pressurizing heating effected with the anisotropic electroconductive film 126 interposed between the electrical connecting members 125 and 127 to have the connecting portion 102 of the semiconductor element 101 electrically connected to the connecting portion 402 of the semiconductor element 400.

In the present embodiment, the respective semiconductor elements 101 and 400 were connected to the electrical connecting members 125 and 127 before connection with the anisotropic electroconductive film 126 interposed between the electrical connecting members 125 and 127, but all of them may be connected at the same time, and the order of connection may be any desired one.

According to the present embodiment, despite the fact that the connecting portions 102 and 402 of the semiconductor elements 101, 400 are concave-shaped, an electrical circuit member with good quality and good reliability could be obtained.

In the embodiment as described above, by use of one having the holding members 105 and 505 of the two electrical connecting members 125 and 127 mutually joined at a part of the peripheral portion of the anisotropic electroconductive member 2 to be integrated, the above two electrical connecting members 125 and 127 can be integrated. Also in the present embodiment, similarly the two electrical connecting members 125 and 127 can be integrated.

The present invention having the constitution as described above can give a number of effects as follows.

(1) In connection between semiconductor elements and electrical circuit parts such as circuit substrate, lead frame, etc., highly reliable connection can be obtained. Therefore, it can take the place of the wire bonding system, TAB system, CCB system, etc. which have been employed in the prior art.

(2) According to the present invention, the connecting portion of an electrical circuit part can be arranged at any position (particularly in inner portion), and therefore connection to more points than in the wire bonding system or TAB system becomes possible, whereby a system suitable for multi-pin number connection is obtained. Further, by previous existence of an insulating member between the adjacent electroconductive members of electrical connecting members, no electrical conduction will occur even if the arrangement pitch may be made smaller, whereby further multi-point connection than CCB system is rendered possible.

(3) The amount of the metal portion used in electrical connecting member is finer in amount as compared with the prior art, and therefore the cost is lower even if an expensive metal such as gold, etc. may be employed for the metal portion.

(4) An electrical circuit device such as semiconductor devices of high density can be obtained.

(5) Even if the area of the connecting portion may be made fine to reduce the connecting area, stable connection can be obtained by holding with an adhesive, and also reliability becomes higher, whereby still higher density can be obtained.

(6) Since connection is effected by curing with an adhesive, connection at low temperature becomes possible, whereby even connection of a part with no heat resistance can be done.

(7) The connecting method can be varied for each surface and the desired portion of each surface of the electrical connecting member, connection by metallization and/or alloy formation or connection by pressurization can be employed depending on the electrical circuit part, whereby it has become possible to provide connections to many kinds of electrical circuit parts corresponding to their demands.

In the present embodiment as described above, bonding of narrower pitch and more pins is possible than the bonding with the anisotropic electroconductive film of the prior art, and yet connection with low resistance value is possible to enable connection with less floating capacity, and further electrical characteristics are improved by reduction of the leak current between wirings. Further, connection of the electrical circuit parts with concave-shaped connecting portion becomes easier. Also, thermal stress is relaxed more than the bonding of the electrical connecting members of the prior art, and one with large difference in thermal expansion coefficient mutually between the electrical circuit parts is available, and therefore the scope of choice can be expanded along with improvement of quality reliability.

Further, in the present embodiment, bonding at lower temperature is rendered possible, whereby bonding can be done more easily to expand the scope of choice of electrical circuit parts to give inexpensive electrical circuit members.

Further, in the present embodiment, the connection strength can be increased to give an electrical circuit member with characteristics having lower connection resistance value.

Further, in the present embodiment, connection mutually between the electrical circuit parts with the connecting portions being concave-shaped can be done well.

What is claimed is:

1. A method for producing an electrical circuit member comprising electrical circuit parts electrically connected, comprising the steps of:

positioning and arranging first and second electrical circuit parts having plural electrical connecting portions so that the first and second electrical circuit parts are spaced and oppose each other;

preparing an electrical connecting member having a plurality of electrical conductive members, each of which extends from one side of a holding member of an electrical insulating material therethrough to an opposite side of the holding member and is held in the holding member so that opposing ends of the electrical conductive member protrude from opposite sides of the holding member;

applying an adhesive to at least one side of the electrical connecting member, including the electrical conductive members;

inserting the electrical connecting member, with the adhesive, between the first and second electrical circuit parts; and applying a pressing force so that the first and second electrical parts contact the ends of the electrical conductive members.

2. The method according to claim 1, wherein heating is performed during the pressing step.

3. The method according to claim 1, wherein the step of applying the adhesive to the electrical connecting member further comprises the steps of:

preparing a separator to which the adhesive is applied;

bonding the separator at its upper bonding surface with the electrical connecting member; and removing the separator for transferring the adhesive from the separator to the electrical connecting member.

4. The method according to claim 1, wherein after the pressing step, a heating process is performed at 100°–200° C.

5. The method according to claim 1, wherein the electrical conductive members are made of gold.

6. The method according to claim 1, wherein a nickel layer is formed on the electrical conductive members, and a gold layer is formed on the nickel layer.

7. A method for producing an electrical circuit member comprising electrical circuit parts electrically connected, comprising the steps of:

preparing a first electrical circuit part having plural connecting portions;

preparing an electrical connecting member having a plurality of electrical conductive members, each of which extends from one side of a holding member of an electrical insulating material therethrough to an opposite side of the holding member and is held in the holding member so that opposing ends of the electrical conductive member protrude from opposite sides of the holding member;

applying an adhesive to at least one side of the electrical connecting member, including the electrical conductive members;

bonding the electrical connecting member with the adhesive applied thereto to the first electrical circuit part so that the ends of the electrical conductive members contact the first electrical circuit part; and connecting a second electrical circuit part having plural electrical connecting portions to the electrical connecting member to complete an electrical connection between the first and second electrical circuit parts and form the electric circuit member.

8. The method according to claim 7, further comprising the step of heating the formed electric circuit member to a temperature between 100°–200° C.

9. The method according to claim 7, further comprising the step of subjecting the electrical connecting member to heating and pressing as the electric circuit member is being formed.

10. The method according to claim 7, wherein the electrical conductive members are made of gold.

11. The method according to claim 7, wherein a nickel layer is formed on the electrical conductive members, and a golder layer is formed on the nickel layer.

12. A method for producing an electrical circuit member comprising first and second electrical circuit parts electrically connected, comprising the steps of:

preparing an electrical connecting member having a plurality of electrical conductive members, each of which extends from one side of a holding member of an electrical insulating material therethrough to an opposite side of the holding member and is held in the holding member so that opposing ends of the electrical conductive member protrude from opposite sides of the holding member;

preparing an anisotropic electroconductive member comprising electroconductive particles dispersed in an electrical insulating agent, said electroconductive particles capable of forming an electroconductive path locally through a compressed portion of said anisotropic electroconductive member;

applying an adhesive to the first electrical circuit part;

bonding the electrical connecting member to the first electrical circuit part with the adhesive applied thereto such that the electrical conductive members contact the first electrical circuit part; and sandwiching the anisotropic electroconductive member between the second electrical circuit part and the electrical connecting member for forming an electrical connection between the first and second electrical circuit parts.

13. The method according to claim 12, wherein during the bonding step, a pressing process at 100°–200° C. for press bonding is performed.

14. The method according to claim 13, wherein the electrical conductive members are made of gold.

15. The method according to claim 12, wherein a nickel layer is formed on the electrical conductive members, and a gold layer is formed on the nickel layer.

* * * * *

UNITED STATES PATENT AND TRADEMARK OFFICE
CERTIFICATE OF CORRECTION

PATENT NO. : 5,819,406  Page 1 of 2

DATED : October 13, 1998

INVENTOR(S): Yoshizawa et al.

It is certified that error appears in the above-identified patent and that said Letters Patent is hereby corrected as shown below:

On title page, item
[56] REFERENCES CITED:

FOREIGN PATENT DOCUMENTS, "422096" should read -17-2096--,
   "6057944" should read --60-57944--, and
   "6178069" should read --61-78069--.

COLUMN 3:

Line 56, "but" should be deleted.
Line 65, "but" should be deleted.

COLUMN 5:

Line 15, "bump" should read --the bump--.
Line 18, "bump" should read --the bump--.
Line 42, "contrivances" should be deleted.

COLUMN 11:

Line 51, "microns, $\mu$m," should read --$\mu$m--.

COLUMN 15:

Line 42, "coated" should read --coating--.

UNITED STATES PATENT AND TRADEMARK OFFICE
CERTIFICATE OF CORRECTION

PATENT NO. : 5,819,406

DATED : October 13, 1998

INVENTOR(S) : Yoshizawa et al.

It is certified that error appears in the above-identified patent and that said Letters Patent is hereby corrected as shown below:

COLUMN 16:

Line 15, "pm" should read --$\mu$m--.

COLUMN 19:

Line 63, "connectical" should read --connecting--.

COLUMN 27:

Line 5, "golder" should read --gold--.

Signed and Sealed this

Tenth Day of August, 1999

Attest:

Q. TODD DICKINSON

Attesting Officer

Acting Commissioner of Patents and Trademarks